(12) United States Patent
Jeon

(10) Patent No.: US 11,482,588 B2
(45) Date of Patent: Oct. 25, 2022

(54) DISPLAY DEVICE HAVING A FLOATING CONDUCTIVE LAYER

(71) Applicant: SAMSUNG DISPLAY CO., LTD., Yongin-si (KR)

(72) Inventor: Sangjin Jeon, Yongin-si (KR)

(73) Assignee: SAMSUNG DISPLAY CO., LTD., Yongin-si (KR)

(*) Notice: Subject to any disclaimer, the term of this patent is extended or adjusted under 35 U.S.C. 154(b) by 0 days.

(21) Appl. No.: 16/889,208

(22) Filed: Jun. 1, 2020

(65) Prior Publication Data
US 2020/0381508 A1    Dec. 3, 2020

(30) Foreign Application Priority Data
Jun. 3, 2019 (KR) .................. 10-2019-0065470

(51) Int. Cl.
*H01L 27/14* (2006.01)
*H01L 27/32* (2006.01)
(Continued)

(52) U.S. Cl.
CPC ........ *H01L 27/3276* (2013.01); *H01L 27/322* (2013.01); *H01L 27/3223* (2013.01); *H01L 51/5253* (2013.01); *G09G 2300/0408* (2013.01); *G09G 2300/0413* (2013.01); *G09G 2300/0804* (2013.01); *H01L 27/14678* (2013.01); *H01L 27/3253* (2013.01); *H01L 51/0096* (2013.01); *H01L 51/5234* (2013.01); *H01L 2251/301* (2013.01); *H01L 2251/305* (2013.01)

(58) Field of Classification Search
CPC ............... H01L 27/3276; H01L 27/322; H01L 27/3223; H01L 51/5253; H01L 51/5234; H01L 51/0096; H01L 2251/301; H01L 27/3297; H01L 27/3295; H01L 27/3253; H01L 27/14678; G02F 2001/133357; G09G 2300/0408; G09G 2300/0413; G09G 2300/0804
See application file for complete search history.

(56) References Cited

U.S. PATENT DOCUMENTS 6,683,671 B1 * 1/2004 Morimoto ........... G02F 1/13394
349/155
7,002,647 B2 * 2/2006 Tanaka .............. G02F 1/133371
257/89

(Continued)

FOREIGN PATENT DOCUMENTS

KR    10-2017-0029761    3/2017
KR    10-2017-0079570    7/2017
(Continued)

*Primary Examiner* — Ida M Soward
(74) *Attorney, Agent, or Firm* — F. Chau & Associates, LLC

(57) ABSTRACT

A display device includes a first substrate having a display area and a non-display area. The first substrate includes a conductive line in the non-display area. A second substrate faces the first substrate and is spaced apart from the first substrate. A conductive layer is disposed between the first substrate and the second substrate. The conductive layer is spaced apart from the first substrate in a direction perpendicular to a top surface of the first substrate. The conductive layer at least partially overlaps the conductive line and is electrically floated.

10 Claims, 18 Drawing Sheets

(51) Int. Cl.
*H01L 51/00* (2006.01)
*H01L 51/52* (2006.01)
*H01L 27/146* (2006.01)

(56) References Cited

U.S. PATENT DOCUMENTS

| | | | | |
|---|---|---|---|---|
| 7,009,664 | B2 * | 3/2006 | Imayama | G02F 1/1339 |
| | | | | 349/43 |
| 8,617,910 | B2 * | 12/2013 | Lee | G02F 1/13452 |
| | | | | 438/26 |
| 9,406,725 | B2 * | 8/2016 | Yamazaki | H01L 27/323 |
| 9,543,542 | B2 * | 1/2017 | Kim | H01L 51/5246 |
| 10,891,889 | B2 * | 1/2021 | Veidhes | G02F 1/133345 |
| 2004/0135957 | A1 * | 7/2004 | Arai | G02F 1/1345 |
| | | | | 349/149 |
| 2004/0141128 | A1 * | 7/2004 | Kim | G02F 1/13454 |
| | | | | 349/138 |
| 2004/0207788 | A1 * | 10/2004 | Yamaguchi | G02F 1/133707 |
| | | | | 349/130 |
| 2004/0245533 | A1 * | 12/2004 | Imazeki | G02F 1/13394 |
| | | | | 257/93 |
| 2005/0117093 | A1 * | 6/2005 | Kim | G02F 1/133514 |
| | | | | 349/106 |
| 2005/0122036 | A1 * | 6/2005 | Park | H01L 27/3251 |
| | | | | 313/504 |
| 2007/0046606 | A1 * | 3/2007 | Kim | G09G 3/3648 |
| | | | | 345/90 |
| 2007/0153167 | A1 * | 7/2007 | Jang | G02F 1/133512 |
| | | | | 349/110 |
| 2007/0153171 | A1 * | 7/2007 | Kim | G02F 1/133555 |
| | | | | 349/114 |
| 2010/0163879 | A1 * | 7/2010 | Jung | H01L 27/124 |
| | | | | 438/30 |
| 2014/0160413 | A1 * | 6/2014 | Nishida | G02F 1/134309 |
| | | | | 349/123 |
| 2014/0198268 | A1 * | 7/2014 | Sugita | G06F 3/0412 |
| | | | | 349/12 |
| 2014/0285754 | A1 * | 9/2014 | Lee | G02F 1/133711 |
| | | | | 349/106 |
| 2015/0179727 | A1 * | 6/2015 | Kim | G09G 3/3225 |
| | | | | 257/40 |
| 2016/0357042 | A1 * | 12/2016 | Yoon | G02F 1/134309 |
| 2016/0370665 | A1 * | 12/2016 | Choi | G02F 1/134309 |
| 2017/0285424 | A1 * | 10/2017 | Kwak | G02F 1/1339 |
| 2018/0190724 | A1 * | 7/2018 | Kang | H01L 27/323 |
| 2018/0144684 | A1 | 10/2018 | Kim et al. | |
| 2018/0308912 | A1 | 10/2018 | Kim et al. | |
| 2019/0227365 | A1 * | 7/2019 | Park | G02F 1/133512 |
| 2019/0294284 | A1 * | 9/2019 | Akimoto | G06F 3/04164 |
| 2019/0312232 | A1 * | 10/2019 | Yamazaki | H01L 51/5253 |
| 2021/0175321 | A1 * | 6/2021 | Chung | G09G 3/3266 |

FOREIGN PATENT DOCUMENTS

| | | |
|---|---|---|
| KR | 10-2018-0056442 | 5/2018 |
| KR | 10-2018-0118857 | 11/2018 |

* cited by examiner

DISPLAY DEVICE HAVING A FLOATING CONDUCTIVE LAYER

CROSS-REFERENCE TO RELATED APPLICATION

This application claims priority under 35 U.S.C. § 119 to Korean Patent Application No. 10-2019-0065470, filed on Jun. 3, 2019 in the Korean Intellectual Property Office, the disclosure of which is incorporated by reference in its entirety herein.

1. TECHNICAL FIELD

One or more embodiments relate to a display device, and more particularly, to a display device that may prevent an element from being damaged by static electricity.

2. DISCUSSION OF RELATED ART

Static electricity that is applied to a display device may flow into the display panel. Static electricity that flows into the display panel may cause shocks to be applied on elements of the display panel, such as a thin-film transistor in the display panel. The shocks may cause a defect to the display panel which results in the deterioration of the image quality of the display device.

SUMMARY

One or more embodiments include a display device that may prevent an element from being damaged by static electricity. However, the one or more embodiments are only examples, and the scope of the present disclosure is not limited thereto.

Additional aspects will be set forth in part in the description which follows and, in part, will be apparent from the description, or may be learned by practice of the presented embodiments of the disclosure.

According to one or more exemplary embodiments, a display device includes a first substrate having a display area and a non-display area. The first substrate includes a conductive line in the non-display area. A second substrate faces the first substrate and is spaced apart from the first substrate. A conductive layer is disposed between the first substrate and the second substrate. The conductive layer is spaced apart from the first substrate in a direction perpendicular to a top surface of the first substrate. The conductive layer at least partially overlaps the conductive line and is electrically floated.

The conductive layer may include a transparent conductive layer arranged on an entire surface of the second substrate facing the first substrate.

The conductive layer may form a first capacitor, with the conductive line, and store static electricity flowing into the conductive layer.

The display device may further include a dummy wire arranged in the non-display area of the first substrate, being spaced apart from the conductive line in a direction parallel to the top surface of the first substrate, and arranged outside the conductive line.

The dummy wire may be arranged outside a driving circuit unit of the non-display area.

The dummy wire may be connected to a dummy pad to which a ground voltage is applied.

The display device may further include a pixel arranged in the display area of the first substrate and including a display element including a first electrode, a second electrode, and an emission layer. The second electrode faces the first electrode and the emission layer is arranged between the first electrode and the second electrode.

The dummy wire may be electrically connected to a power line in contact with the second electrode of the display element in the non-display area of the first substrate.

The dummy wire may extend along at least a side of the first substrate in the non-display area of the first substrate.

The conductive layer may overlap the dummy wire in a direction perpendicular to a surface of the first substrate, and the conductive layer may form a second capacitor with the dummy wire, and static electricity stored in the second capacitor is discharged via the dummy wire.

According to one or more exemplary embodiments, a display device includes a substrate which includes a display area and a non-display area. The substrate includes a conductive line in the non-display area. A thin-film encapsulation layer covers the substrate. A conductive layer is disposed on the thin-film encapsulation layer and is spaced apart from the conductive line in a direction perpendicular to a top surface of the substrate. The conductive layer at least partially overlaps the conductive line, and is electrically floated.

The conductive layer may include a transparent conductive layer arranged on an entire surface of the thin-film encapsulation layer.

The conductive layer may form a first capacitor with the conductive line and store static electricity flowing into the conductive layer.

The display device may further include a dummy wire arranged in the non-display area of the first substrate that is spaced apart from the conductive line in a direction parallel to the top surface of the substrate, and is disposed outside the conductive line. The thin-film encapsulation layer does not cover the dummy wire.

The dummy wire may be connected to a dummy pad to which a ground voltage is applied.

The display device may further include a pixel arranged in the display area of the substrate and including a display element including a first electrode, a second electrode, and an emission layer. The second electrode faces the first electrode and the emission layer is arranged between the first electrode and the second electrode.

The dummy wire may be electrically connected to a power line in contact with the second electrode of the display element in the non-display area of the substrate.

The dummy wire may be arranged outside a driving circuit unit of the non-display area.

The conductive layer may overlap the dummy wire in a direction perpendicular to a surface of the substrate, and static electricity stored in the second capacitor is discharged via the dummy wire.

The display device may further include a color filter on the conductive layer.

According to one or more exemplary embodiments, a method for manufacturing a display device includes forming a lower substrate including a display area and a non-display area. A conductive line and dummy wire is formed in the non-display area. The conductive line and dummy wire are spaced apart from each other in a direction parallel to a top surface of the lower substrate. An upper substrate is formed that faces the lower substrate and is spaced apart from the lower substrate. An electrically floated conductive layer is formed between the lower substrate and the upper substrate. At least one electrostatic capacitor is formed between the upper substrate and the lower substrate. The at least one electrostatic capacitor is selected from a first capacitor formed by the electrically floated conductive layer and the conductive line and a second capacitor formed by the electrically floated conductive layer and the dummy wire.

BRIEF DESCRIPTION OF THE DRAWINGS

The above and other aspects, features, and advantages of certain exemplary embodiments of the present inventive concepts will be more apparent from the following description taken in conjunction with the accompanying drawings, in which.

DETAILED DESCRIPTION OF THE EXEMPLARY EMBODIMENTS

Figure 1:
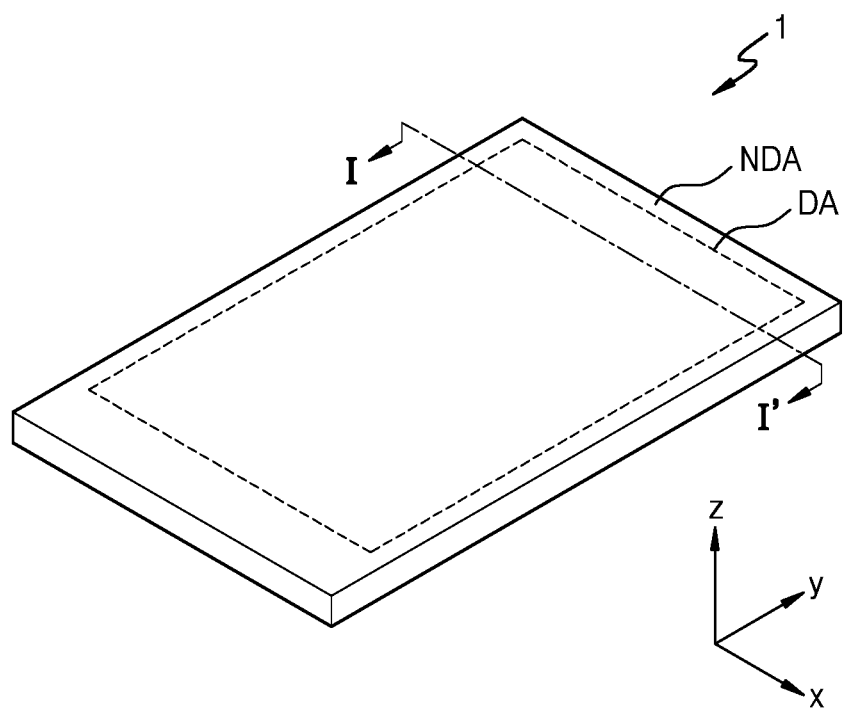
FIG. 1 is a perspective view of a portion of a display device according to an exemplary embodiment of the present inventive concepts.

As the present disclosure allows for various changes and numerous embodiments, particular exemplary embodiments will be illustrated in the drawings and described in detail in the written description. Effects and features of the present disclosure and a method of achieving the same will become apparent to those skilled in the art from the following detailed description which discloses various exemplary embodiments of the present inventive concepts in conjunction with the annexed drawings. The present disclosure may, however, be embodied in many different forms and should not be construed as being limited to the exemplary embodiments set forth herein.

Hereinafter, exemplary embodiments of the present inventive concepts will be described in detail with reference to the accompanying drawings. In the description of the present disclosure, certain detailed explanations of the related art are omitted when it is deemed that they may unnecessarily obscure the essence of the present disclosure. Like numbers refer to like elements throughout the description of the figures.

It will be understood that when a layer, region, or element is referred to as being "formed on," another layer, region, or element, it can be directly or indirectly formed on the other layer, region, or element. For example, intervening layers, regions, or elements may be present. Sizes of elements in the drawings may be exaggerated for convenience of explanation. In other words, since sizes and thicknesses of elements in the drawings are arbitrarily illustrated for convenience of explanation and the following embodiments are not limited thereto.

It will be understood that when a layer, region, or element is referred to as being "connected to" or "coupled to" another layer, region, or element, it may be "directly connected or coupled" to the other layer, region, or element, or "indirectly connected to" the other layer, region, or element with intervening elements therebetween. For example, when a layer, region, or element is referred to as being electrically "connected to" or "coupled to" another layer, region, or element, it may be electrically "directly connected or coupled" to the other layer, region, or element, or electrically "indirectly connected to" the other layer, region, or element with intervening elements therebetween.

When a certain exemplary embodiment may be implemented differently, a specific process order may be different from a described one. For example, two processes that are consecutively described may be performed substantially at the same time or performed in an order opposite to the described order.

It will be understood that although the terms "first". "second", etc, may be used herein to describe various elements, these elements should not be limited by these terms. These terms are only used to distinguish one element from another. As used herein, the singular forms "a," "an" and "the" are intended to include the plural forms as well, unless the context clearly indicates otherwise. It will be further understood that the terms "comprises," "comprising," "includes," and/or "including," when used herein, specify the presence of elements, but do not preclude the presence or addition of one or more other elements, unless otherwise specified.

As used herein, when a wire is referred to as being "extending in a first direction or a second direction", the wire may extend in a straight form, or extend in a zigzag or curved form along the first direction or the second direction.

When an expression "on a plane" is used, this indicates a case when an object is viewed from above the object. When an expression "on a cross-section" is used, this indicates a case when a cross-section of an object taken in a direction perpendicular to the object is viewed from a side of the object. As used herein, the term "overlapping" refers to overlapping "on a plane" and/or "in a cross-section"

It will be further understood that a signal generally refers to a voltage or current unless otherwise described. As used herein, a reference designation "C" used to denote a capacitor not only denotes a capacitor but also a capacitance that is a size of a capacitor. For example, C1 is a reference designation denoting a capacitor, and also denotes a capacitance that is a size of the capacitor. In addition, both a manufactured capacitor and a naturally formed capacitor are denoted as a capacitor.

Figure 2:
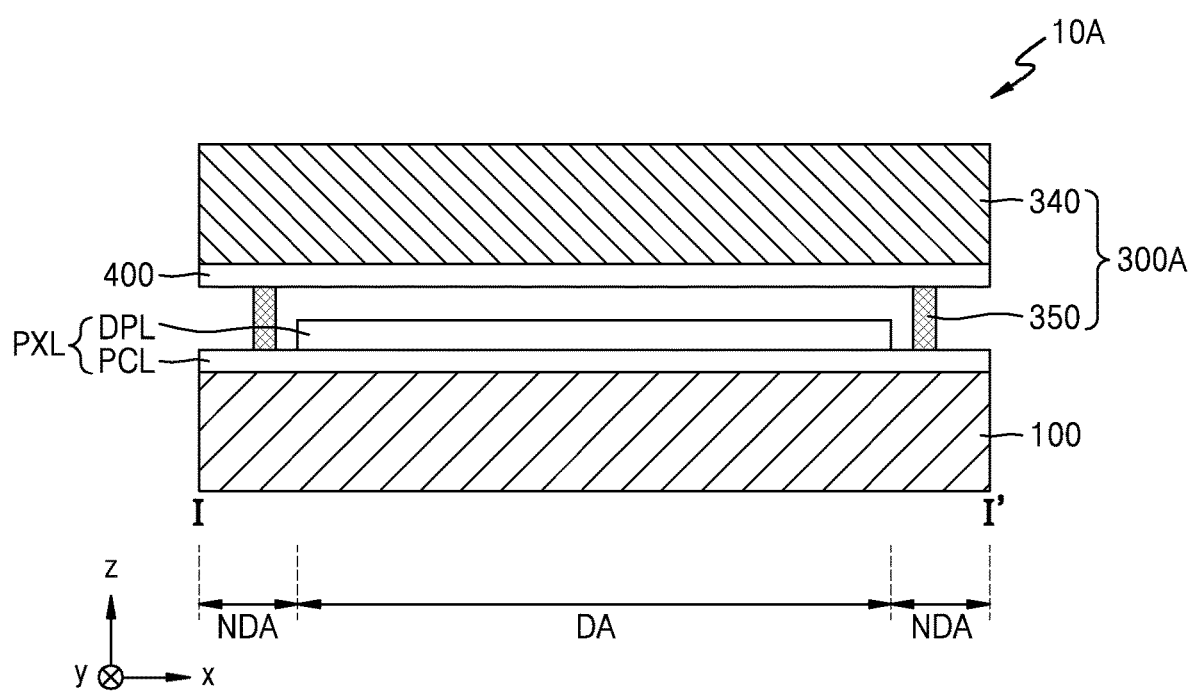
FIGS. 2 to 4 are cross-sectional views of the display device, taken along a line I-I' of FIG. 1 according to exemplary embodiments of the present inventive concepts.
Figure 3:
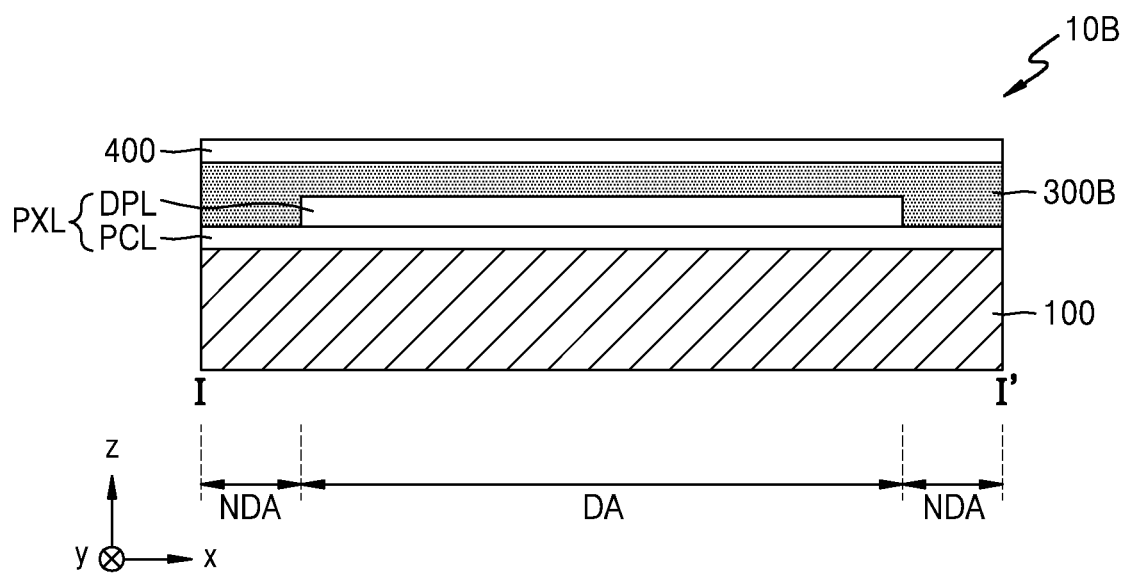
Figure 4:
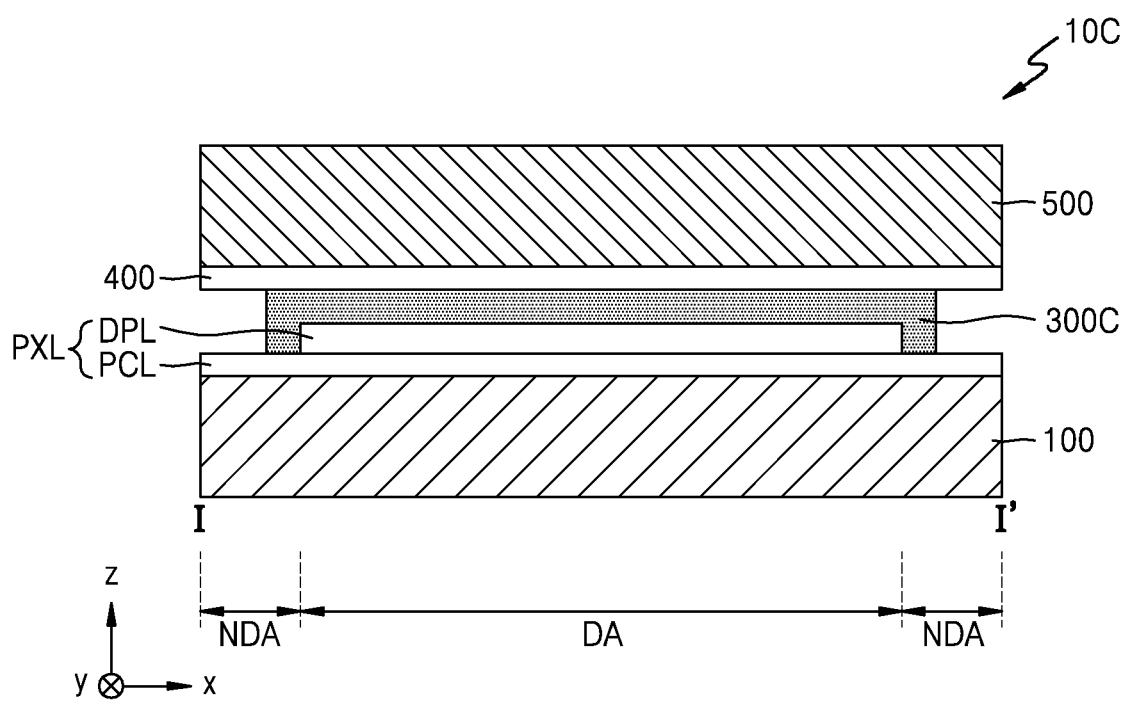

FIG. 1 is a perspective view of a portion of a display device 1 according to an exemplary embodiment of the present inventive concepts. FIGS. 2 to 4 are cross-sectional views of the display device 1, taken along a line I-I' of FIG. 1 according to exemplary embodiments of the present inventive concepts.

Referring to FIG. 1, the display device 1 according to an exemplary embodiment includes a display area DA in which light is emitted and a non-display area NDA in which light is not emitted. The non-display area NDA is arranged to surround the display area DA in a periphery of the display area DA. For example, as shown in FIG. 1, the non-display area NDA may surround the display area in the x and/or y directions. However, exemplary embodiments of the present inventive concepts are not limited thereto. The non-display area NDA may include various wires/conductive lines delivering (or providing) an electrical signal to the display area DA and a driving circuit unit. The display device 1 may provide a predetermined image by using light emitted from a plurality of pixels arranged in the display area DA. A partial area of the non-display area NDA of the display device 1 may include a bending area that is configured to be bent.

The display device 1 may be an organic light-emitting display device, an inorganic light-emitting display device (or an inorganic electroluminescent (EL) display device), a quantum-dot light-emitting display device, etc. Hereinafter, the organic light-emitting display device is described as an example of the display device 1. However, exemplary embodiments of the present inventive concepts are not limited thereto. The display device 1 may be implemented as various types of electronic devices such as a mobile phone, a laptop, a smart watch, etc.

As shown in FIGS. 2 to 4, the display device 1 may include a display panel 10A, 10B, or 10C, respectively. The display panel (10A, 10B, and 10C in FIGS. 2-4, respectively) includes a substrate 100 and an encapsulation member (300A, 300B, and 300C in FIGS. 2-4, respectively) that seals the substrate 100. The substrate 100 and the encapsulation member 300A, 300B, 300C are sequentially stacked in the z-direction which is perpendicular to a top surface of the substrate 100 that extends in the x and y directions.

The substrate 100 may include a glass material or a polymer resin. For example, the substrate 100 may include a glass material having silicon oxide ($SiO_2$) as a main composition or various flexible or bendable materials, such as reinforced plastic. A portion of the non-display area NDA of the substrate 100 may include a bending area that is configured to be bent.

A pixel layer PXL may be arranged on the substrate 100. The pixel layer PXL may include a display element layer DPL and a pixel circuit layer PCL. The display element layer DPL includes display elements arranged in each pixel. The pixel circuit layer PCL includes a pixel circuit PC (shown in FIG. 6) and insulating layers both arranged in each pixel. The display element layer DPL is arranged on the pixel circuit layer PCL. A plurality of insulating layers may be arranged between the pixel circuit PC and the display elements. Some conductive lines and insulating layers of the pixel circuit layer PCL may extend to the non-display area NDA.

Referring to FIG. 2, the encapsulation member 300A may include an encapsulation substrate 340 and a sealant 350. The substrate 100 may be coupled to the encapsulation substrate 340 by the sealant 350. The encapsulation substrate 340 may include a transparent material. For example, the encapsulation substrate 340 may include various materials, such as a glass material, a plastic material such as polyethylene terephthalate (PET), polyethylene naphthalate (PEN), polyimide, etc. The substrate 100 may include a material that is the same as or different from the material of the encapsulation substrate 340. The sealant 350 may surround the display area DA in a plan view (e.g., in the x and y directions). A space defined by the substrate 100, the encapsulation substrate 340, and the sealant 350 may be sealed from the outside to thereby prevent penetration of external moisture or impurities. A filling material may be arranged between the pixel layer PXL and the encapsulation substrate 340. The filling material may include at least one selected from a photocurable epoxy-based material and an acrylate-based material. However, exemplary embodiments of the present inventive concepts are not limited thereto.

In another exemplary embodiment, as shown in FIG. 3, the encapsulation member 300B may include a thin-film encapsulation layer. The thin-film encapsulation layer may include at least one inorganic encapsulation layer and at least one organic encapsulation layer. In embodiments in which the display device 1 includes the substrate 100 and the encapsulation member 300B which includes the thin-film encapsulation layer, the substrate 100 may include a polymer resin and the encapsulation member 300B may include an inorganic encapsulation layer and an organic encapsulation layer which provides the display device 1 with increased flexibility.

In the exemplary embodiment shown in FIG. 4, a color filter 500 may be further provided over the encapsulation member 300C that includes a thin-film encapsulation layer. For example, the color filter 500 may be disposed directly on a conductive layer 400 in the z direction. In an exemplary embodiment, the color filter 500 may be formed separately from the encapsulation member 300C and is then subsequently coupled to the encapsulation member 300C. The color filter 500 may include a color filter substrate and a plurality of color filter layers on the color filter substrate. In an exemplary embodiment, the color filter layers may include a red, green, or blue pigment or dye considering a color of light emitted from each pixel. Alternatively, the color filters 500 may further include quantum dots, in addition to the pigment or the dye described above. Alternatively, some of the color filters 500 may not include the pigment or the dye described above and may include scattering particles such as titanium oxide. In another exemplary embodiment, the color filter 500 may be formed directly on the encapsulation member 300C. For example, the color filter 500 may be formed sequentially after a process of forming the encapsulation member 300C is performed. In this embodiment, the color filter substrate may be omitted. The color filter 500 may also be coupled to the encapsulation member 300C by using a sealant.

The display panels 10A, 10B, and 10C include a conductive layer 400 as an electrostatic protection member. The conductive layer 400 is configured to protect a pixel P of the display area DA and/or the driving circuit unit in the non-display area NDA against static electricity flowing from the outside.

As shown in the exemplary embodiment of FIG. 2, the conductive layer 400 may be provided on a bottom surface (e.g., in the z direction) of the encapsulation substrate 340. For example, a top surface (e.g., in the z direction) of the conductive layer 400 may be directly disposed on a bottom surface (e.g., in the z direction) of the encapsulation substrate 340. The bottom surface (e.g., in the z direction) of the conductive layer may faced the pixel layer PXL and may be in direct contact with the sealant 350. Alternatively, as shown in the exemplary embodiment of FIG. 3, the bottom surface (e.g., in the z direction) of the conductive layer 400 may be directly disposed on the entire top surface (e.g., in the z direction) of the encapsulation member 300B. As shown in the exemplary embodiment of FIG. 4, the conductive layer 400 may be provided between the color filter 500 and the encapsulation member 300C. In an exemplary embodiment, the conductive layer 400 may be provided as an element of the color filter 500. For example, the conductive layer 400 may be arranged on a entire bottom surface (e.g., in the z direction) of the color filter substrate of the color filter 500 that faces the substrate 100 and is coupled to an upper portion (e.g., in the z direction) of the encapsulation member 300C. In another exemplary embodiment, the conductive layer 400 may be entirely formed on the encapsulation member 300C after a process of forming the encapsulation member 300C is formed. Thereafter, the color filter 500 may be formed on the conductive layer 400 or coupled to an upper surface of the conductive layer 400.

The conductive layer 400 may include a transparent conductive layer. The transparent conductive layer may include a conductive metal material. The conductive metal material may include, for example, transparent conductive oxide, indium tin oxide (ITO), tin oxide (TO), indium zinc oxide (IZO), indium tin zinc oxide (ITZO), etc. The transparent conductive layer may include a transparent conductive resin. The transparent conductive resin may include, for example, a compound of ITO powder and acryl(ITO powder+acryl), conductive epoxy, etc.

The conductive layer 400 may be an electrically-floated conductive layer that is not electrically connected to a separate voltage source and/or current source. Therefore the electrically-floated conductive layer 400 does not receive a voltage and/or current from a voltage source or a current source of the display device 1.

The display device 1 may further include a touchscreen, a polarizing plate, and a window or the like on the encapsulation member 300A, 300B, or 300C. For example, the conductive layer 400 may be provided between the substrate 100 and a touchscreen, a polarizing plate, or a window. Alternatively, the conductive layer 400 may be provided between the encapsulation member 300B or 300C and a touchscreen, a polarizing plate, or a window.

Figure 5:
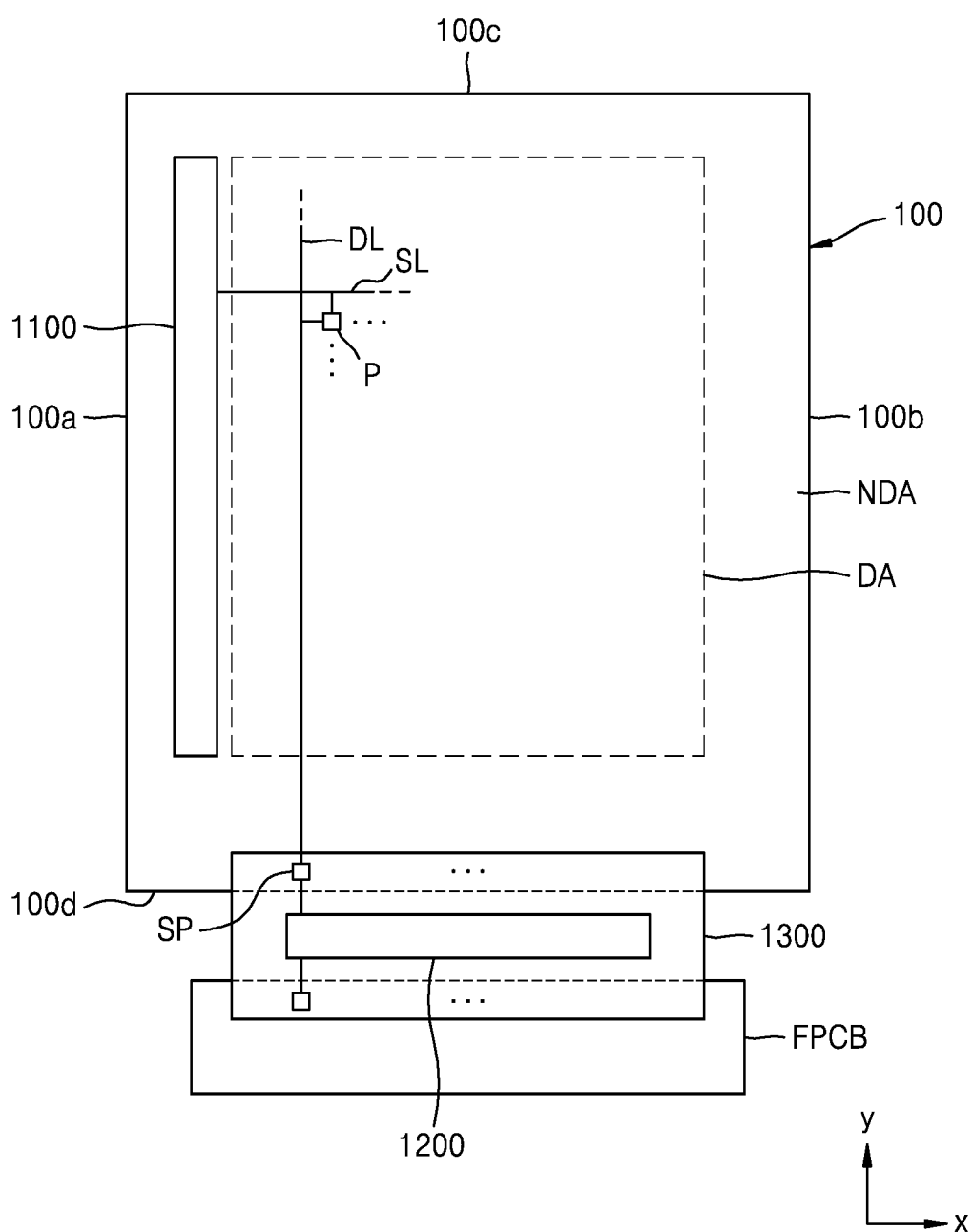
FIG. 5 is a top plan view illustrating a portion of a display panel according to an exemplary embodiment of the present inventive concepts.
Figure 6:
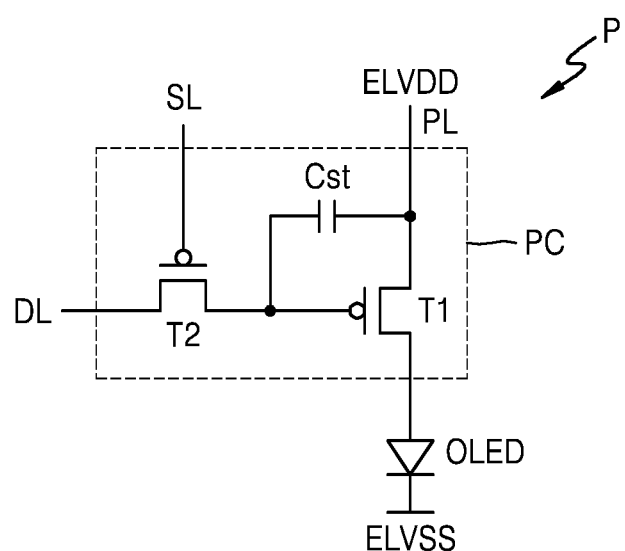
FIG. 6 is a pixel according to an exemplary embodiment of the present inventive concepts.

FIG. 5 is a top plan view illustrating a portion of a display panel 10A, 10B, or 10C according to an exemplary embodiment. FIG. 6 is a diagram illustrating a pixel P according to an exemplary embodiment of the present inventive concepts.

Referring to FIG. 5, the substrate 100 may include the display area DA and the non-display area NDA. The non-display area NDA may surround the display area DA along a first side 100a, a second side 100b, a third side 100c, and a fourth side 100d of the substrate 100. However, in other exemplary embodiments, the display area DA and the non-display area NDA may have various different shapes. Furthermore, the non-display area NDA may be disposed on a different number of sides.

A plurality of pixels P may be provided on the substrate 100. The plurality of pixels P may be arranged in a predetermined pattern in the x-direction (e.g., a row direction) and the y direction (e.g., a column direction).

Referring to FIG. 6, the pixels P include the pixel circuit PC and a display element. The pixel circuit PC is connected to a scan line SL and a data line DL and the display element is connected to the pixel circuit PC. While the exemplary embodiment shown in FIG. 6 includes one scan line SL and one data line DL connected to the pixel circuit PC, in other exemplary embodiments a plurality of scan lines SL and/or data lines DL may be connected to the pixel circuit. The pixel circuit PC may include at least one transistor and a capacitor Cst. The display element may include an organic light-emitting diode OLED.

The pixel circuit PC may include a first transistor T1, a second transistor T2, and a capacitor Cst. Each of the pixels P may emit, for example, red, green, blue, or white light via the organic light-emitting diode OLED. The first transistor T1 and the second transistor T2 may be implemented as a thin-film transistor.

The second transistor T2 is a switching transistor, and may be connected to the scan line SL and the data line DL. According to a scan signal input from the scan line SL, the second transistor T2 may provide a data signal that is input from the data line DL to the first transistor T1. The capacitor Cst is connected to the second transistor T2 and a power voltage line PL. The capacitor Cst may store a voltage corresponding to a difference between a voltage corresponding to the data signal provided from the second transistor T2 and a first power voltage ELVDD supplied to the power voltage line PL.

The first transistor T1 is a driving transistor, and may be connected to the power voltage line PL and the capacitor Cst. The first transistor T1 may control the driving of a current flowing from the power voltage line PL to the organic light-emitting diode OLED in correspondence with a value of the voltage stored in the capacitor Cst.

The organic light-emitting diode OLED may emit light having a predetermined brightness according to the driving current. The organic light-emitting diode OLED may include a pixel electrode, an opposite electrode, and an emission layer therebetween. The opposite electrode of the organic light-emitting diode OLED may receive a second power voltage ELVSS.

In the exemplary embodiment shown in FIG. 6 the pixel circuit PC includes two transistors and one capacitor. However, exemplary embodiments of the present inventive concepts are not limited thereto. For example, the number of transistors and the number of capacitors may be variously modified according to a design of the pixel circuit PC.

Referring back to FIG. 5, a scan driver 1100, a data driver 1200, main power lines, (such as an electrode power supply line 420 shown in FIG. 18, etc.) may be arranged in the non-display area NDA on the substrate 100. The scan driver 1100 provides a scan signal to each of the pixels P, the data driver 1200 provides a data signal to each of the pixels P, and the main power lines are configured to provide the first power voltage ELVDD and the second power voltage ELVSS. The first power voltage ELVDD may be different from the second power voltage ELVSS. The second power voltage ELVSS may be lower than the first power voltage ELVDD. For example, the first power voltage ELVDD may be a positive voltage, and the second power voltage ELVSS may be a negative voltage or a ground voltage. A plurality of signal pads SP may be arranged in the non-display area NDA on the substrate 100. The signal pads SP may be connected to the data line DL. For example, as shown in FIG. 5, the signal pads SP may be arranged in the non-display area NDA of the substrate 100 adjacent to the fourth side 100d of the substrate 100.

The scan driver 1100 may include an oxide semiconductor thin-film transistor (TFT) gate driver circuit (OSG) or an amorphous silicon TFT gate driver circuit (ASG). FIG. 5 illustrates an example in which the scan driver 1100 is arranged adjacent to the first side 100a of the substrate 100. However, in other exemplary embodiments, the scan driver 1100 may be arranged adjacent to the first side 100a and the second side 100b of the substrate 100, respectively.

FIG. 5 illustrates a chip-on-film (COF) method in which the data driver 1200 is arranged on a film 1300 that is electrically connected to the signal pads SP on the substrate 100. In another exemplary embodiment, the data driver 1200 may be arranged directly on the substrate 100 (e.g., adjacent to the third side 100c or the fourth side 100d of the substrate 100) by using a chip-on-glass (COG) method or a chip-on-plastic (COP) method. The data driver 1200 may be electrically connected to a flexible printed circuit board (FPCB).

Figure 7:
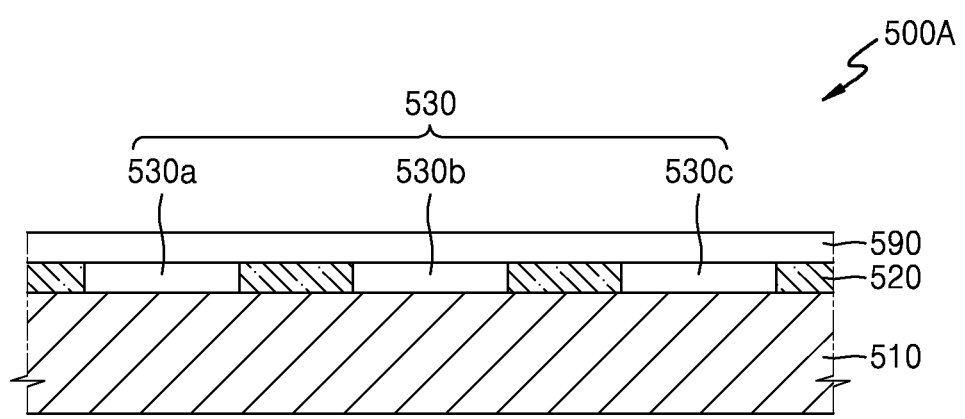
FIGS. 7 and 8 are cross-sectional views illustrating a portion of a color filter according to an exemplary embodiment of the present inventive concepts.
Figure 8:
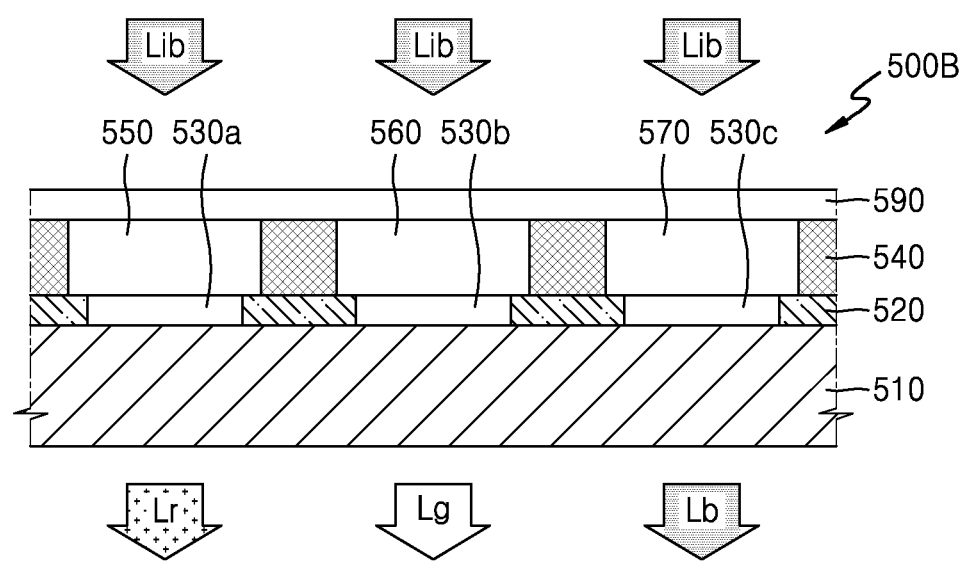

FIGS. 7 and 8 are cross-sectional views illustrating portions of color filters 500A and 500B according to an exemplary embodiment.

Referring to FIGS. 7 and 8, the color filters 500A and 500B may include a color filter substrate 510 and a color filter layer 530.

The color filter substrate 510 is not particularly limited. For example, the color filter substrate 510 may include, an insulating material such as glass, plastic, a crystal, etc. The color filter substrate 510 may include, for example, an organic polymer material such as polycarbonate (PC), PET, polyethylene (PE), polypropylene (PP), Polysulfone (PSF), polymethyl methacrylate (PMMA), cellulose triacetate (TAC), a cyclic olefin polymer (COP), cyclic olefin copolymer (COC), etc. The color filter substrate 510 may be selected based on properties, including, mechanical strength, thermal stability, transparency, surface smoothness, ease of treatment, water resistance, etc.

The color filter layer 530 may be an organic pattern including a pigment or a dye. The color filter layer 530 may include a first color filter layer 530a, a second color filter layer 530b, and a third color filter layer 530c. The first to third color filter layers 530a, 530b, and 530c may be arranged to overlap at least the display element (e.g., in a direction perpendicular to a top surface of the substrate) to thereby selectively transmit light of a predetermined color among light emitted by the display element. A light-blocking member 520 may be arranged between the first to third color filter layers 530a, 530b, and 530c.

The light-blocking member 520 may be arranged to overlap a pixel-defining layer arranged between display elements. Therefore, the light-blocking member 520 may prevent light from being emitted in the display area DA in the area in which the light-blocking member 520 is arranged. Accordingly, the light-blocking member 520 prevents leaking of the light. In exemplary embodiments in which the light-blocking member 520 is black, the light-blocking member 520 may include a black matrix. When the light-blocking member 520 is white, the light-blocking member 520 may include an organic insulating material such as white resin, etc. The light-blocking member 520 may include an opaque inorganic insulating material such as chrome oxide ($CrO_x$) or molybdenum oxide ($MoO_x$) or an opaque organic insulating material such as black resin, etc. However, exemplary embodiments of the present inventive concepts are not limited thereto.

Referring to FIG. 8, the color filter 500B may further include a first color conversion layer 550, a second color conversion layer 560, and a transmissive layer 570.

The first color conversion layer 550 is arranged to overlap the first color filter layer 530a (e.g., in a direction perpendicular to atop surface of the color filter substrate 510). For example, as shown in FIG. 8, a bottom surface of the first color conversion layer 550 may be disposed directly on a top surface of the first color filter layer 530a. The first color conversion layer 550 converts incident light Lib into light Lr of a first color to thereby emit the light Lr of the first color toward the color filter substrate 510. For example, the first color conversion layer 550 may include first quantum dots excited by the incident light Lib to thereby emit the light Lr of the first color having a wavelength longer than that of the incident light Lib.

The second color conversion layer 560 is arranged to overlap the second color filter layer 530b (e.g., in a direction perpendicular to a top surface of the color filter substrate 510). For example, as shown in FIG. 8, a bottom surface of the second color conversion layer 560 may be disposed directly on a top surface of the second color filter layer 530b. The second color conversion layer 560 converts the incident light Lib to light Lg of a second color to thereby emit the light Lg of the second color toward the color filter substrate 510. The second color conversion layer 560 may include second quantum dots excited by the incident light Lib to thereby emit the light Lg of the second color having a wavelength longer than that of the incident light Lib.

The transmissive layer 570 is arranged to overlap the third color filter layer 530c. For example, as shown in FIG. 8, a bottom surface of the transmissive layer 570 may be disposed directly on a top surface of the third color filter layer 530c. The transmissive layer 570 transmits light Lb of a third color. Therefore, the transmissive layer 570 receives the incident light Lib of the third color and emits the light Lb of the third color toward the color filter substrate 510.

At least one partition wall 540 may be further located between the first color conversion layer 550, the second color conversion layer 560, and the transmissive layer 570 in a horizontal direction (e.g., in a direction parallel to a top surface of the color filter substrate 510). Each of the partition walls 540 may be arranged in a position overlapping the light-blocking member 520 (e.g., in a direction perpendicular to a top surface of the color filter substrate 510). The partition wall 540 may include a same material as the material of the light-blocking member 520. The partition wall 540 may be in contact with side surfaces of the first color conversion layer 550, the second color conversion layer 560, and the transmissive layer 570. The partition walls 540 may prevent the light Lr of the first color emitted from the first color conversion layer 550 from leaking to the second color conversion layer 560 or the transmissive layer 570. The partition walls 540 may prevent the light Lg of the second color emitted from the second color conversion layer 560 from leaking to the first color conversion layer 550 or the transmissive layer 570. The partition walls 540 may prevent the light Lb of the third color emitted from the transmissive layer 570 from reaching the first color conversion layer 550 or the second color conversion layer 560.

The light-blocking member 520 and the partition walls 540 may prevent a part of light emitted from the display element from being incident on the first or second color conversion layer 550 or 560 or the transmissive layer 570 in an adjacent pixel area. Accordingly, since color mixture between pixel areas may be prevented, a color matching rate and color reproducibility are enhanced and light efficiency improves. Therefore, power consumption may be reduced.

The color filters 500A and 500B may further include a planarization layer 590 that provides a flat upper surface. In FIG. 7, the planarization layer 590 may be arranged over the color filter substrate 510 to cover the color filter layer 530 and the light-blocking member 520. For example, the planarization layer 590 may be disposed directly on top surfaces of the color filter layer and light-blocking members 520. In FIG. 8, the planarization layer 590 may be arranged over the color filter substrate 510 to cover the first and second color conversion layers 550 and 560 and the transmissive layer 570. For example, the planarization layer 590 may be disposed directly on top surfaces of the first color conversion layer 550, second color conversion layer 560, transmissive layer 570 and partition walls 540. The planarization layer 590 may be transparent. The planarization layer 590 may include a single layer or multiple layers including an inorganic material such as silicon nitride ($SiN_x$) and/or silicon oxide ($SiO_x$). In another exemplary embodiment, the planarization layer 590 may include a transparent organic material such as polyimide resin, acrylic resin, a resist material, etc. The planarization layer 590 may be formed by using a wet process such as a slit coating method, a spin coating method, etc., or a dry process such as a chemical vapor deposition method, a vacuum deposition method, etc. However, the present exemplary embodiment is not limited to the materials and the methods of forming the planarization layer 590 described above. For example, in some exemplary embodiments, the planarization layer 590 may be omitted.

Figure 9:
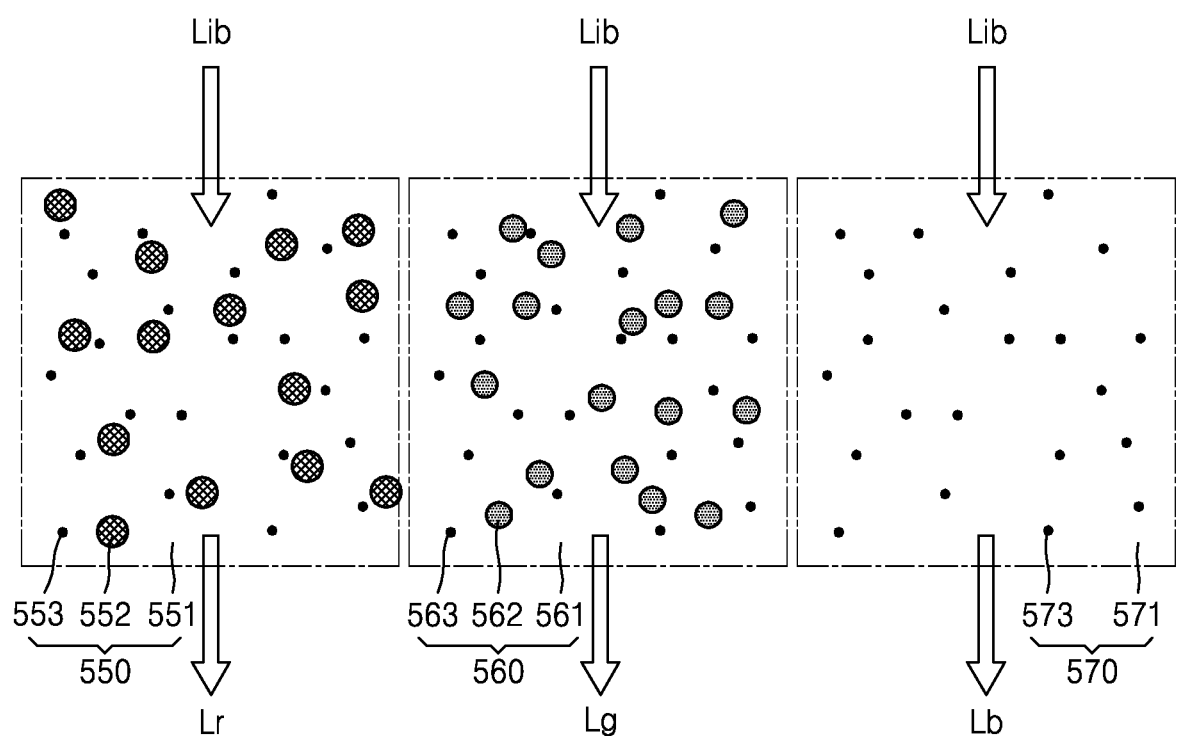
FIG. 9 is a magnified cross-sectional view of first and second conversion layers and a transmissive layer, each shown in FIG. 8 according to an exemplary embodiment of the present inventive concepts.

FIG. 9 is a magnified cross-sectional view of the first and second conversion layers 550 and 560 and the transmissive layer 570 of FIG. 8.

Referring to FIG. 9, the first color conversion layer 550 converts the incident light Lib of a blue color into the light Lr of the first color. For example, the first color may be red. The first color conversion layer 550 may include a first photosensitive polymer 551 in which first quantum dots 552 and first scattering particles 553 are dispersed.

The first quantum dots 552 may be excited by the blue incident light Lib to thereby isotropically emit the light Lr of the first color having a wavelength longer than the wavelength of the blue incident light Lib. The first photosensitive polymer 551 may be an organic material having light transmissibility. The first scattering particles 553 scatter blue incident light Lib that was not absorbed by the first quantum dots 552 to excite many first quantum dots 552 to increase a color conversion rate of the first color conversion layer 550. The first scattering particles 553 may include, for example, titanium dioxide ($TiO_2$) or metal particles. A core of the first quantum dots 552 may include at least one selected from: a Group II-VI compound material, a Group III-V compound material, a Group IV-VI compound material, a Group IV element, a Group IV compound material, or a combination thereof.

The second color conversion layer 560 converts the blue incident light Lib to the light Lg of the second color. For example, the second color may be green. The second color conversion layer 560 may include a second photosensitive polymer 561 in which second quantum dots 562 and second scattering particles 563 are dispersed.

The second quantum dots 562 may be excited by the blue incident light Lib to thereby isotropically emit the light Lg of the second color having a wavelength longer than that of the blue incident light Lib. The second photosensitive polymer 561 may include an organic material having light transmissibility. The second photosensitive polymer 561 may include the same material as the first photosensitive polymer 551. The second scattering particles 563 scatter the blue incident light Lib that was not absorbed by the second quantum dots 562 to excite more second quantum dots to thereby increase a color conversion rate of the second color conversion layer 560. The second scattering particles 563 may include, for example, $TiO_2$ or metal particles. The second scattering particles 563 may include the same material as the first scattering particles 553. In an exemplary embodiment, the core of the second quantum dots 562 may include at least one selected from: a Group II-VI compound material, a Group III-V compound material, a Group IV-VI compound material, a Group IV element, a Group IV compound material, or a combination thereof. The second quantum dots 562 may include the same material as the first quantum dots 552. In this embodiment, the size of the second quantum dots 562 may be less than the size of the first quantum dots 552.

The transmissive layer 570 may transmit the blue incident light Lib to thereby emit the blue incident light Lib toward the color filter substrate 510. The transmissive layer 570 may include a third photosensitive polymer 571 in which third scattering particles 573 are scattered. The third photosensitive polymer 571 may include an organic material having light transmissibility such as silicon resin, epoxy resin, etc. The third photosensitive polymer 571 may include the same material as the first and second photosensitive polymers 551 and 561. The third scattering particles 573 may emit the blue incident light Lib by scattering the blue incident light Lib. The third scattering particles 573 may include the same material as the first and second scattering particles 553 and 563.

The II-VI Group compound material may be selected from a group consisting of at least one selected from: a binary compound selected from a group consisting of cadmium selenide (CdSe), cadmium telluride (CdTe), zinc sulfide (ZnS), zinc selenide (ZnSe), zinc telluride (ZnTe), zinc oxide (ZnO), mercury sulfide (HgS), mercury selenide (HgSe), mercury telluride (HgTe), magnesium selenide (MgSe), magnesium sulfide (MgS), and a mixture thereof; a ternary compound selected from a group consisting of silver-indium-sulfide (AgInS), copper-indium-sulfide (CuInS), cadmium selenide sulpfide (CdSeS), cadmium selenotelluride (CdSeTe), cadmium sulfur telluride (CdSTe), zinc selenium sulfide (ZnSeS), zinc selenide telluride (ZnSeTe), zinc sulfide telluride (ZnSTe), mercury selenium sulfide (HgSeS), mercury selenium telluride (HgSeTe), mercury sulfide telluride (HgSTe), cadmium zinc sulfide (CdZnS), cadmium zinc selenide (CdZnSe), cadmium zinc telluride (CdZnTe), cadmium mercury sulfide (CdHgS), cadmium mercury selenide (CdHgSe), cadmium mercury telluride (CdHgTe), mercury zinc sulfide (HgZnS), mercury zinc selenide (HgZnSe), mercury zinc telluride (HgZnTe), magnesium zinc selenide (MgZnSe), magnesium zinc sulfide (MgZnS), and a mixture thereof, and a quaternary compound selected from a group consisting of mercury zinc telluride sulfide (HgZnTeS), cadmium zinc selenide sulfide (CdZnSeS), cadmium zinc selenium telluride (CdZnSeTe), cadmium zinc sulfide telluride (CdZnSTe), cadmium mercury selenium sulfide (CdHgSeS), cadmium mercury selenium telluride (CdHgSeTe), cadmium mercury sulfide telluride (CdHgSTe), mercury zinc selenium sulfide (HgZnSeS), mercury zinc selenium telluride (HgZnSeTe), mercury zinc sulfide telluride (HgZnSTe), and a mixture thereof.

The III-V Group compound material may be selected from a group consisting of at least one selected from: a binary compound selected from a group consisting of gallium nitride (GaN), gallium phosphide (GaP), gallium arsenide (GaAs), gallium antimonide (GaSb), aluminum nitride (AlN), aluminum phosphide (AP), aluminum arsenide (AlAs), aluminum antimonide (AlSb), indium nitride (InN), indium phosphide (InP), indium arsenide (InAs), indium antimonide (InSb), and a mixture thereof; a ternary compound selected from a group consisting of gallium nitride phosphide (GaNP), gallium nitride arsenide (GaNAs), gallium nitride antimonide (GaNSb), gallium phosphide arsenide (GaPAs), gallium phosphide antimonide (GaPSb), alumina nitride phosphide (AlNP), aluminum nitride arsenide (AlNAs), alumina nitride antimonide (AlNSb), aluminum phosphide arsenide (AlPAs), aluminum phosphide antimonide (AlPSb), indium gallium phosphide (InGaP), indium nitride phosphide (InNP), indium nitride arsenide (InNAs), indium nitride antimonide (InNSb), indium phosphide arsenide (InPAs), indium phosphide antimonide (InPSb), and a mixture thereof; and a quaternary compound selected from a group consisting of gallium alumina nitride phosphide (GaAlNP), gallium aluminum nitride arsenide (GaAlNAs), gallium aluminum nitride antimonide (GaAlNSb), gallium aluminum phosphide arsenide (GaAlPAs), gallium aluminum phosphide antimonide (GaAlPSb), gallium indium nitride phosphide (GaInNP), gallium indium nitride arsenide (GaInNAs), gallium indium nitride antimonide (GaInNSb), gallium indium phosphide arsenide (GaInPAs), gallium indium phosphide antimonide (GaInPSb), indium aluminum nitride phosphide (InAlNP), indium aluminum nitride arsenide (InAlNAs), indium aluminum nitride antimonide (InAlNSb), indium aluminum phosphide arsenide (InAlPAs), indium aluminum phosphide antimonide (InAlPSb), and a mixture thereof.

The Group IV-VI compound material may be selected from a group consisting of at least one selected from: a binary compound selected from a group consisting of tin sulfide (SnS), tin selenide (SnSe), tin telluride (SnTe), lead(II) sulfide, lead Selenide (PbSe), lead telluiide (PbTe), and a mixture thereof; a ternary compound selected from a group consisting of tin selenium sulfide (SnSeS), tin selenium telluride (SnSeTe), tin sulphotelluride (SnSTe), lead selenium sulfide (PbSeS), lead selenium telluride (PbSeTe), lead sulfide telluride (PbSTe), tin lead sulfide (SnPbS), tin lead selenide (SnPbSe), tin lead telluride (SnPbTe), and a mixture thereof; and a quaternary compound selected from a group consisting of tin lead sulfide selenide (SnPbSSe), tin lead selenium telluride (SnPbSeTe), tin lead sulfide telluride (SnPbSTe), and a mixture thereof. The Group IV element may be selected from a group consisting of silicon (Si), germanium (Ge), and a mixture thereof. The Group IV compound material may be a binary compound selected from a group consisting of silicon carbide (SiC), silicon-germanium (SiGe), and a mixture thereof.

In this exemplary embodiment, the binary compound, the ternary compound, or the quaternary compound may be present with a uniform concentration in a particle, or divided into states of different concentration densities and present in a same particle. In addition, the binary compound, the ternary compound, or the quaternary compound may have a core/shell structure in which a quantum dot surrounds another quantum dot. An interface between the core and the shell may include a concentration gradient in which a concentration of an element present in the shell is increasingly reduced.

In some exemplary embodiments, a quantum dot may have a core-shell structure including a core including a nanocrystal and a shell surrounding the core. A shell of the quantum dot may function as a protective layer for maintaining semiconductor characteristics by preventing chemical modification of the core and/or a charging layer for providing electrophoresis characteristics to the quantum dot. The shell may include a single layer or multiple layers. An interface between the core and the shell may include a concentration gradient in which a concentration of an element present in the shell is increasingly reduced toward a center. An example of the shell of the quantum dot may include a metal or non-metal oxide, a semiconductor compound, or a combination thereof.

For example, the metal or non-metal oxide may include at least one compound selected from: a binary compound such as silicon oxide ($SiO_2$), aluminum oxide ($Al_2O_3$), titanium dioxide ($TiO_2$), zinc oxide (ZnO), Manganese(II) oxide (MnO), manganese(III) oxide ($Mn_2O_3$), manganese(II, III) oxide ($Mn_3O_4$), cupric oxide (CuO), iron(II) oxide (FeO), Iron(III) oxide ($Fe_2O_3$), Iron(II, III) oxide ($Fe_3O_4$), cobalt(I) oxide (CoO), Cobalt (II, III) oxide ($Co_3O_4$), nickel oxide (NiO), etc., or a tertiary compound such as magnesium aluminate ($MgAl_2O_4$), cobalt iron oxide ($CoFe_2O_4$), nickel (II) iron(III) oxide ($NiFe_2O_4$), cobalt-manganese oxide ($CoMn_2O_4$), etc. However, exemplary embodiments of the present inventive concepts are not limited thereto.

In addition, in an exemplary embodiment, the semiconductor compound may include cadmium sulfide (CdS), CdSe, CdTe, ZnS, ZnSe, ZnTe, ZnSeS, zinc telluride sulfide (ZnTeS), GaAs, GaP, GaSb, mercury(II) sulfide (HgS), HgSe, HgTe, InAs, InP, InGaP, InSb, AlAs, AlP, AlSb, etc. However, exemplary embodiments of the present inventive concepts are not limited thereto.

A quantum dot may have a full width of half maximum (FWHM) of a light-emitting wavelength spectrum of about 45 nm or less, about 40 nm or less, or about 30 nm or less. In such ranges, color purity or a color gamut may be enhanced. In addition, since light emitted through the quantum dot is emitted in an omnidirection, a light viewing angle may be enhanced.

In addition, the quantum dot may have a form generally used in the relevant art, and is not particularly limited. However, in some exemplary embodiments, the quantum dot may have a shape of a circle, a pyramid, a multi-armed or cubic nanoparticle, a nanotube, a nanowire, a nanofiber, a nanoplate particle, etc.

The quantum dot may adjust a color of emitted light according to a particle size. Accordingly, the quantum dot may have various colors of emitted light such as blue, red, green, etc.

Figure 10:
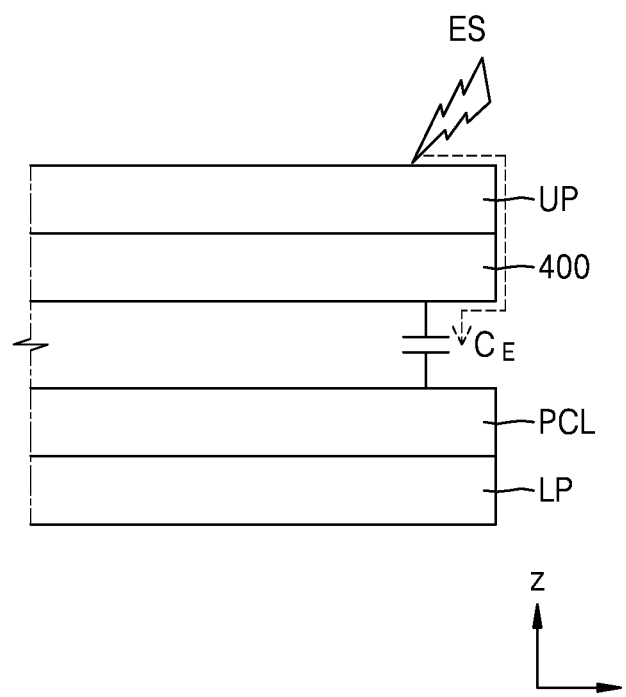
FIG. 10 is a cross-sectional view showing an electrostatic protection function of a conductive layer according to an exemplary embodiment of the present inventive concepts.

FIG. 10 is a cross-sectional view showing an electrostatic protection function of the conductive layer 400 according to an exemplary embodiment.

Referring to FIG. 10, static electricity ES generated from an upper plate UP may be stored in an electrostatic capacitor $C_E$ disposed between the upper plate UP and a lower plate LP. In an exemplary embodiment, the lower plate LP may be the substrate 100 shown in FIGS. 2 to 4. The upper plate UP may be, for example, the encapsulation substrate 340 of FIG. 2, the touchscreen, the polarizing plate, or the window coupled to an upper portion of the conductive layer 400 of FIG. 3, the color filter substrate of the color filter 500 of FIG. 4, or the touchscreen, the polarizing plate, or the window coupled to an upper portion of the color filter 500. However, exemplary embodiments of the present inventive concepts are not limited thereto.

The electrostatic capacitor $C_E$ may be formed by the conductive layer 400 and the pixel circuit layer PCL that are arranged apart from each other in the z direction. For example, the electrostatic capacitor $C_E$ may be formed by the conductive layer 400 and at least one of conductive lines (for example, a power line, a driving voltage line connected to a driving circuit unit, or the like) arranged in the non-display area NDA of the pixel circuit layer PCL. When the static electricity flows into the display device 1, an electric potential according to the static electricity is applied to the conductive layer 400 that is floated. A potential difference in the conductive layer 400 and the conductive lines arranged in the non-display area NDA of the pixel circuit layer PCL may then be stored in the electrostatic capacitor $C_E$. For example, the conductive layer 400 may disperse the static electricity in the conductive layer and store the static electricity in the electrostatic capacitor $C_E$.

If the static electricity is applied to the driving circuit unit in the non-display area NDA or the pixels P of the display area DA, a circuit element, such as a thin-film transistor, etc. may be damaged or a periphery of a wire may be burnt. Therefore, problems, such as a short circuit resulting from the static electricity may occur which results in poor image quality.

In an exemplary embodiment, since the static electricity is stored in the electrostatic capacitor $C_E$ disposed between the upper plate UP and a lower plate LP, the static electricity may be prevented from flowing into the non-display area NDA and the display area DA. Therefore, damage to the driving circuit unit and the pixels P due to static electricity may be eliminated.

Figure 11:
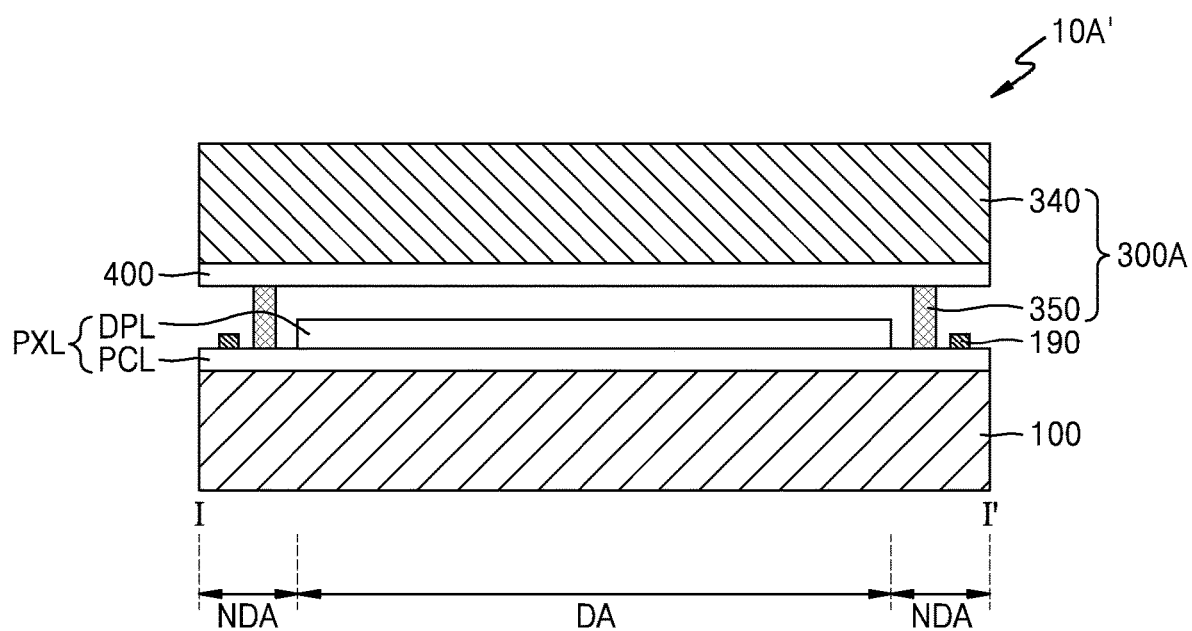
FIGS. 11 to 13 are cross-sectional views of the display device, taken along a line I-I' of FIG. 1 according to other exemplary embodiments of the present inventive concepts.
Figure 12:
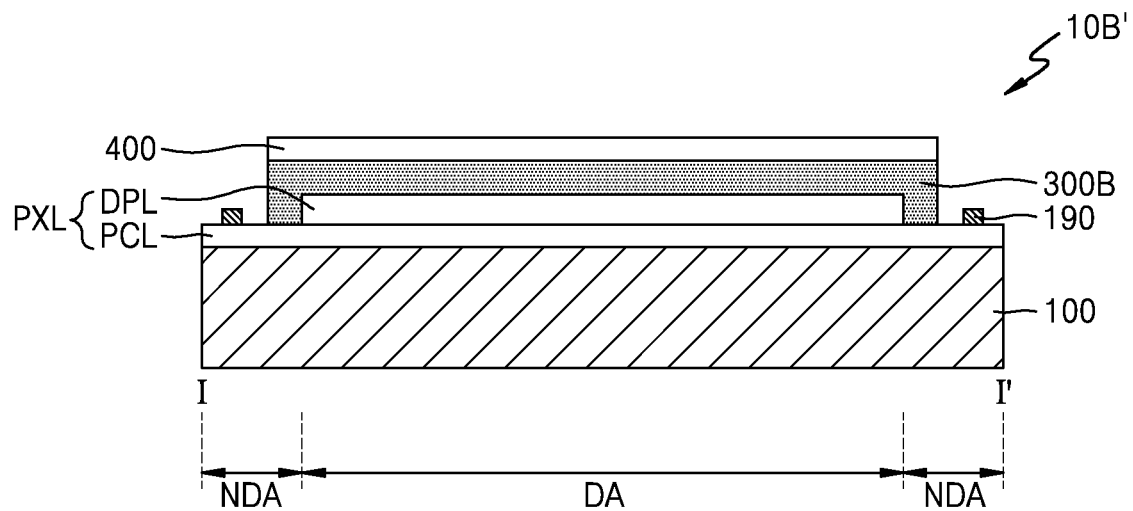
Figure 13:
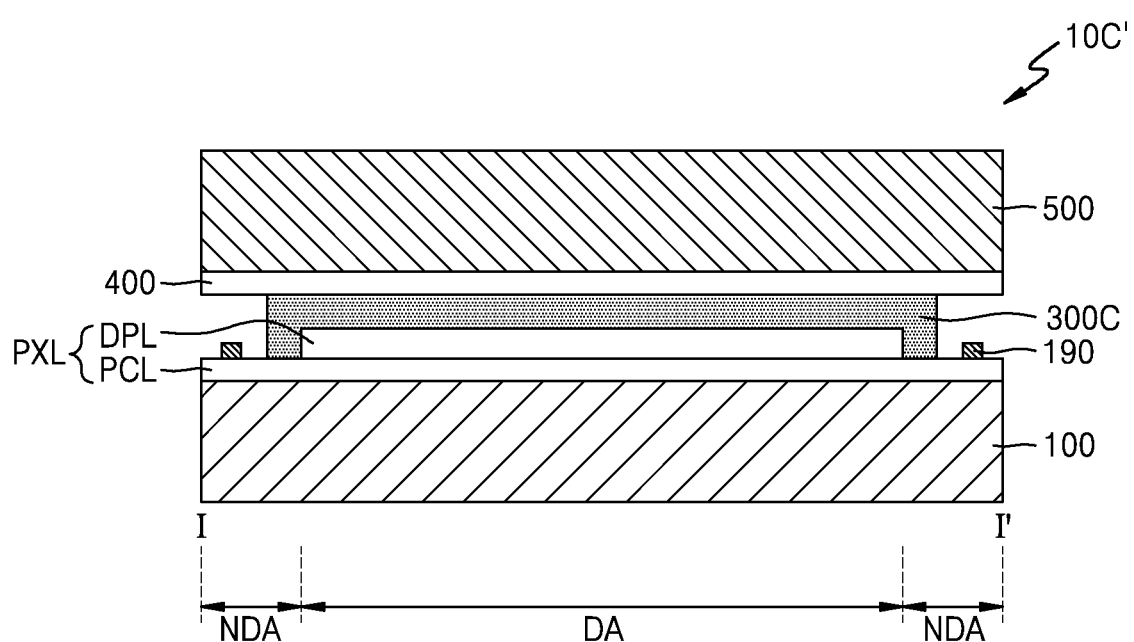
Figure 14:
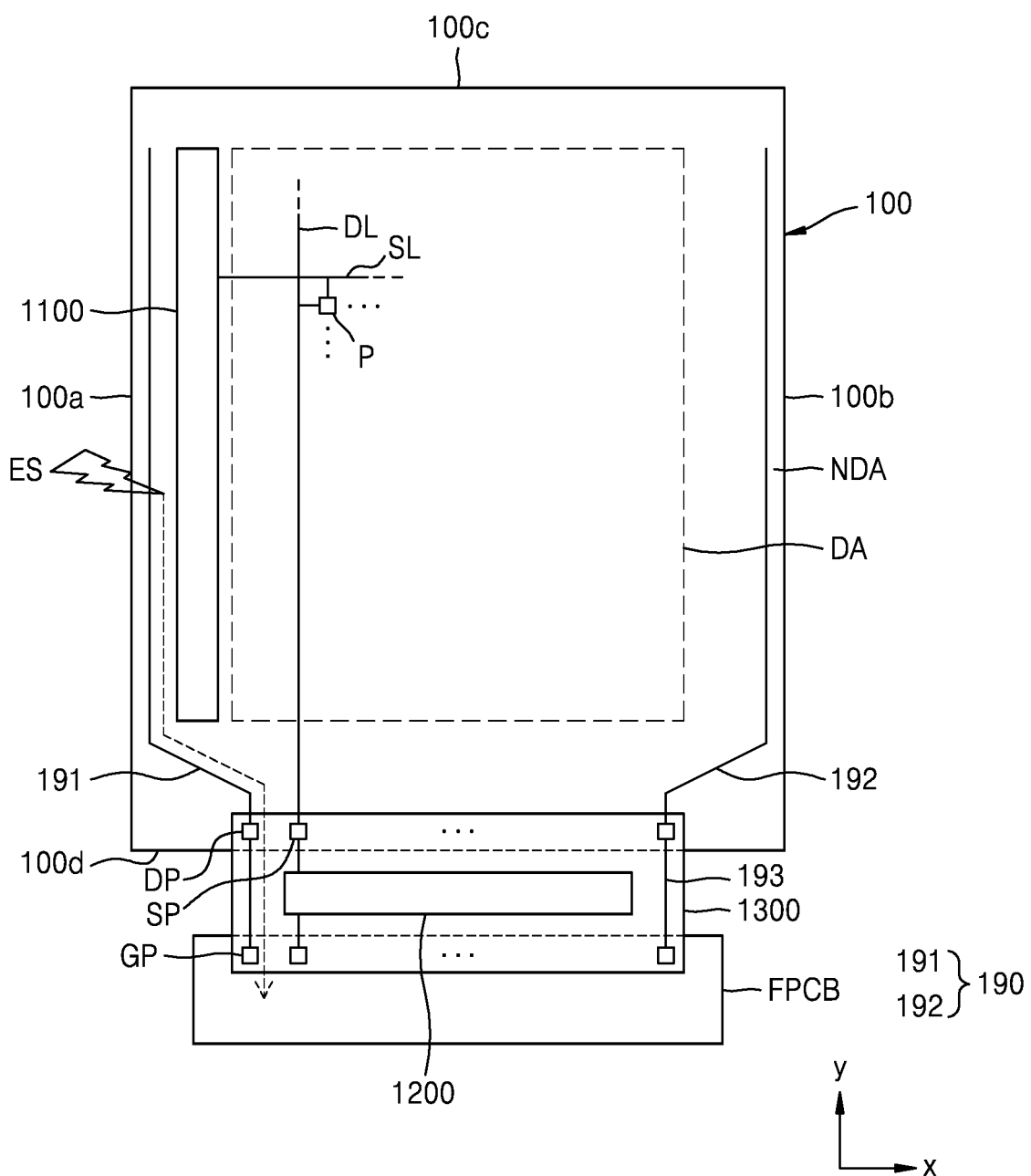
FIGS. 14 to 15 are top plan views illustrating a portion of a display panel of FIGS. 11 to 13 according to exemplary embodiments of the present inventive concepts.
Figure 15:
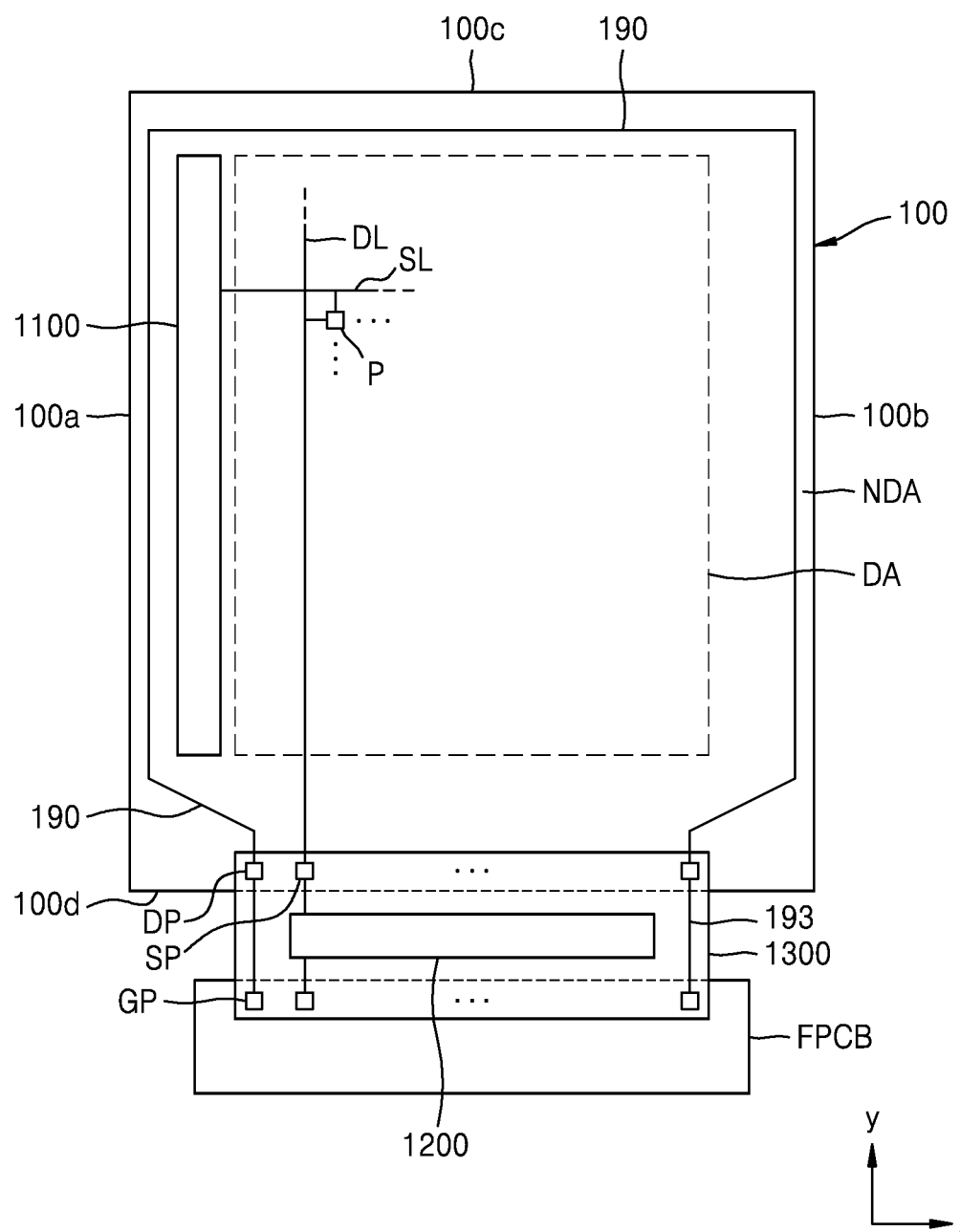
Figure 16:
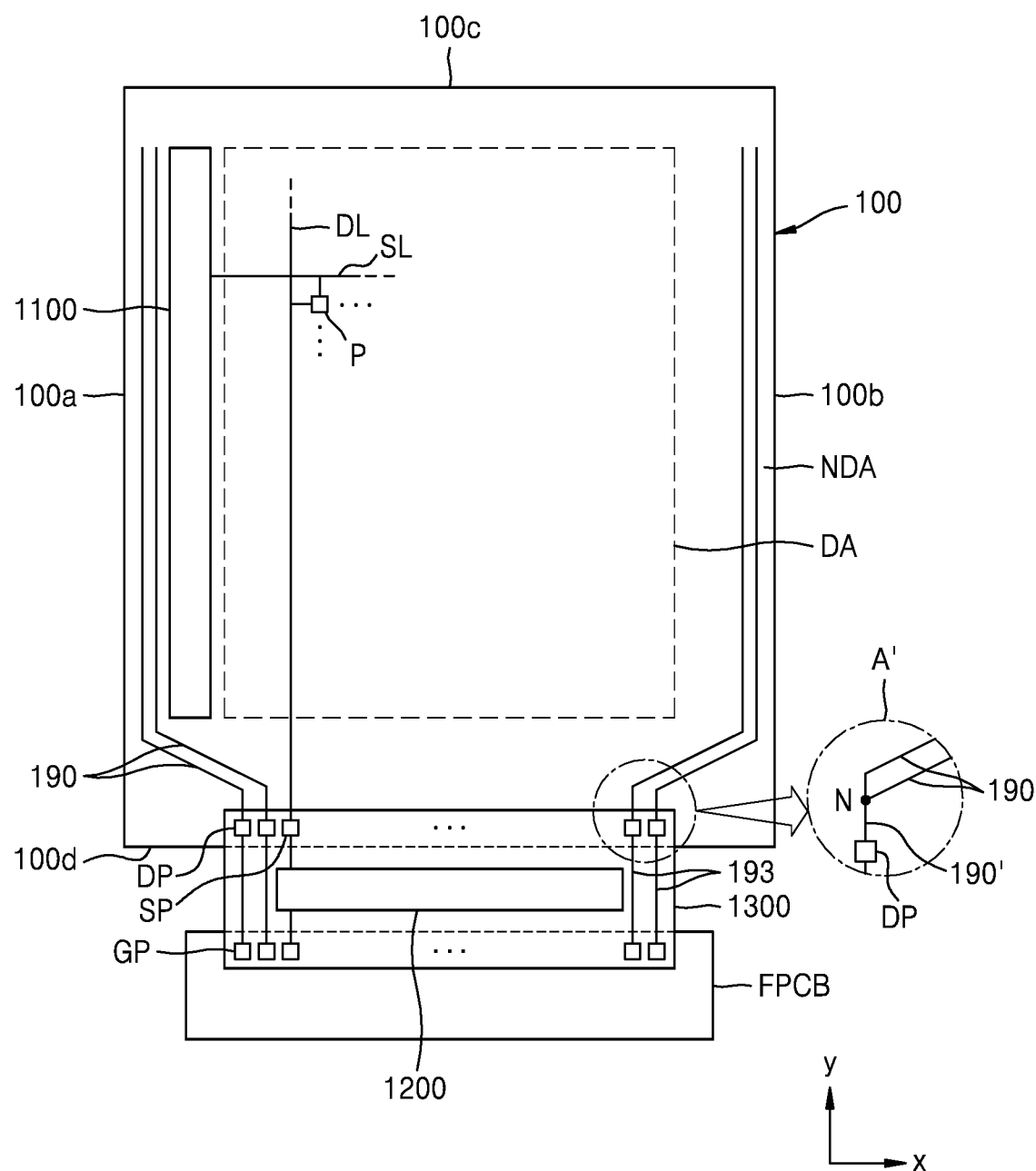
FIG. 16 is a top plan view and magnified view illustrating a portion of a display panel of FIGS. 11 to 13 according to exemplary embodiments of the present inventive concepts.

FIGS. 11 to 13 are cross-sectional views of the display device 1, taken along a line I-P of FIG. 1, according to other exemplary embodiments of the present inventive concepts; FIGS. 14 to 16 are diagrams illustrating a portion of a display panel 10A', 10B', or 10C' of FIGS. 1 to 13. Hereinafter, a description of the elements previously provided above with reference to FIGS. 2 to 10 is omitted.

Referring to FIGS. 11 to 13, a dummy wire (a dummy line) 190 may be further arranged as an electrostatic protection member in the non-display area NDA of the substrate 100 in the display panel 10A', 10B', and 10C' of FIGS. 11-13, respectively. For example, the display device 1 may include the conductive layer 400 as a first electrostatic protection member and the dummy wire 190 as a second protective member to thereby prevent static electricity from damaging a circuit element on the substrate 100.

The display panel 10A' shown in FIG. 11 includes an encapsulation substrate 340 and a sealant 350 which seals the space defined by the substrate 100, the encapsulation substrate 340 and the sealant from the outside as previously described with respect to the exemplary embodiment of FIG. 2. In the exemplary embodiment of FIG. 11, a dummy wire 190 may be disposed on each lateral side between the sealant 350 and the lateral edge of the substrate 100.

The display panel 10B' of FIG. 12 includes an encapsulation member 300B that includes a thin-film encapsulation layer as previously described with respect to the exemplary embodiment of FIG. 3. A conductive layer 400 is disposed on the encapsulation member 300B. A dummy wire 190 may be disposed on each lateral side between the encapsulation member 300B and the lateral edge of the substrate 100. In exemplary embodiments, a touchscreen, polarizing plate, a window or the like may be coupled to an upper portion of the conductive layer 400.

The display panel 10C' of FIG. 13 includes a color filter 500 provided over the encapsulation member 300C that includes a thin-film encapsulation layer as previously described with respect to the exemplary embodiment of FIG. 4. A dummy wire 190 may be disposed on each lateral side between the encapsulation member 300C and the lateral edge of the substrate 100. In exemplary embodiments, a touchscreen, polarizing plate a window or the like may be coupled to an upper portion of the color filter 500.

Referring to FIG. 14, the dummy wire 190 may include a first dummy wire 191 and a second dummy wire 192. The first dummy wire 191 extends along an edge of the first side 100a of the substrate 100 in the y-direction. The second dummy wire 192 extends along an edge of the second side 100b of the substrate 100 facing the first side 100a of the substrate 10a in the y-direction. The first dummy wire 191 and the second dummy wire 192 may be arranged at outermost portions of the substrate 100. For example, the first dummy wire 191 may be arranged outside the scan driver, such as by being positioned closer to the edge of the first side 100a of the substrate than the scan driver 1100. Driver driving wires may be arranged outside the scan driver 1100 (e.g., closer to the edge of the first side 100a of the substrate) and the driver driving wires apply a signal (e.g., a clock signal, a driving signal, etc.) to the scan driver 1100. The first dummy wire 191 may be arranged outside (e.g., closer to the edge of the substrate 100) than the driver driving wires and are spaced apart from the driver driving wires (e.g., in the x direction).

The first dummy wire 191 and the second dummy wire 192 may be each connected to dummy pads DP arranged adjacent to a fourth side 100d of the substrate 100. The dummy pads DP may be electrically connected to a ground pad GP on the flexible circuit board FPCB via dummy connection wires 193. The dummy connection wire 193 may be provided on a film 1300 where the data driver 1200 is arranged. For example, in the exemplary embodiment of FIG. 14, the first dummy wire 191 and second dummy wire 192 are connected to separate dummy pads DP disposed proximate opposing upper lateral edges of the film 1300. Separate dummy connection wires 193 connect each of the separate dummy pads DP to separate ground pads GP disposed proximate opposing lower lateral edges of the film 1300. The first dummy wire 191 and second dummy wire 192 extend from the dummy pads DP in the x and y direction to a lower portion of the non-display area NDA and then extend along the edges of the first side 100a and second side 100b, respectively.

Static electricity flowing from outside may be discharged through the dummy wire 190 (e.g., the first dummy wire 191 and the second dummy wire 192) and the dummy connection wire 193. Accordingly, the flow of static electricity into the non-display area NDA may be prevented so that the driving circuit unit and a pixel are not damaged.

As shown in FIG. 14, the dummy wire 190 may be divided into the first dummy wire 191 and the second dummy wire 192 and arranged at an outer portion of the substrate 100. Alternatively, in the exemplary embodiment shown in FIG. 15, the dummy wire 190 may extend in a continuous form along edges of the first side 100a, the second side 100b, and the third side 100c of the substrate 100. Each end of the dummy wire 190 shown in FIG. 15 is connected to a separate dummy pad DP disposed proximate opposing upper lateral edges of the film 1300. The dummy wire 190 may discharge static electricity via the dummy connection wire 193 and the ground pad GP. FIG. 15 shows the dummy wire 190 as a single wire. However, as shown in FIG. 16, a plurality of separate dummy wires 190 may be provided. For example, as shown in FIG. 16 a plurality of dummy wires 190 may extend along the edges of the first side 100a and the second side 100b of the display device 100 and may be arranged in the x direction. In the exemplary embodiment shown in FIG. 16, two dummy wires extend along the edges of the first side 100a and two dummy wires extend along the edges of the second side 100b of the display device. Each of the dummy wires 190 may be connected to separate dummy pads DP disposed proximate opposing upper lateral edges of the film 1300. The separate dummy pads DP may be arranged in the x direction. In another exemplary embodiment, as shown in an enlarged region A' of FIG. 16, the plurality of dummy wires 190 on each side are connected to the other dummy wires on that side at a node N, and a single dummy wire 190' connected to the node N may be connected to a single dummy pad DP.

Figure 17:
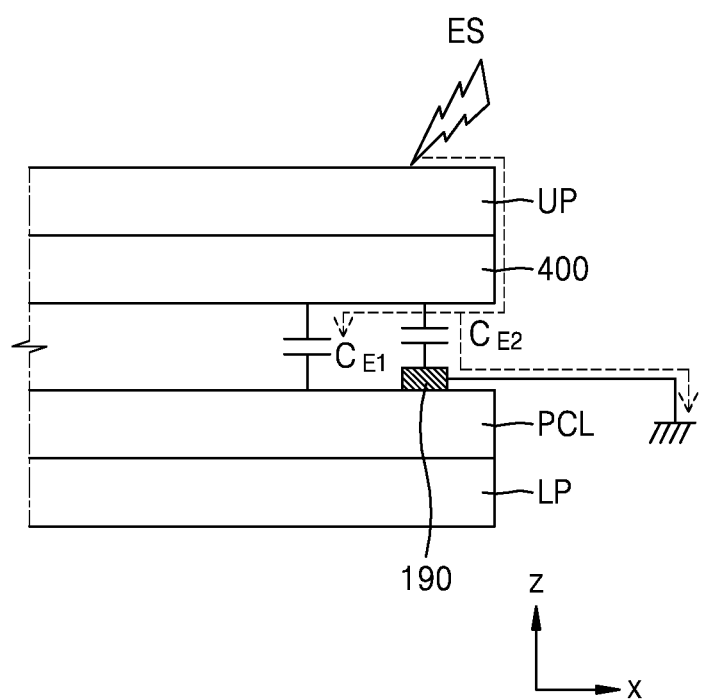
FIG. 17 is a cross-sectional view showing an electrostatic protection function of the conductive layer and a dummy wire according to an exemplary embodiment of the present inventive concepts.

FIG. 17 is a cross-sectional view showing an electrostatic protection function of the conductive layer 400 and the dummy wires 190 according to an exemplary embodiment.

Referring to FIG. 17, the static electricity ES generated from the upper plate UP may be stored in the electrostatic capacitor between the upper plate UP and the lower plate LP. In an exemplary embodiment, the lower plate LP may be the substrate 100 shown in FIGS. 11 to 13. The upper plate UP may be, for example, the encapsulation substrate 340 of FIG. 11, the touchscreen, the polarizing plate, or the window coupled to an upper portion of the conductive layer 400 of FIG. 12, the color filter substrate of the color filter 500 of FIG. 13, or the touchscreen, the polarizing plate, or the window coupled to an upper portion of the color filter 500 of FIG. 13.

The electrostatic capacitor may include a first electrostatic capacitor $C_{E1}$ and a second electrostatic capacitor $C_{E2}$. The first electrostatic capacitor $C_{E1}$ is formed by the conductive layer 400 and the pixel circuit layer PCL that are arranged apart from each other in the z-direction. The second electrostatic capacitor $C_{E2}$ is formed by the conductive layer 400 and the dummy wire 190. When the static electricity flows into the display device 1, an electric potential according to the static electricity is applied to the conductive layer 400. A potential difference between the conductive layer 400 and the conductive lines arranged in the non-display area NDA of the pixel circuit layer PCL may then be stored in the first electrostatic capacitor $C_{E1}$, and/or a potential difference between the conductive layer 400 and the dummy wire 190 may be stored in the second electrostatic capacitor $C_{E2}$. The conductive layer 400 may disperse the static electricity in the conductive layer and store the static electricity in the electrostatic capacitors $C_{E1}$ and $C_{E2}$. The static electricity stored in the second electrostatic capacitor $C_{E2}$ may be discharged through a grounding unit (e.g., the ground pad GP of FIG. 14). In addition, static electricity generated in the lower plate LP may be discharged from the dummy wire 190 and the grounding unit. Accordingly, in an exemplary embodiment, as the static electricity is stored in the electrostatic capacitors $C_{E1}$ and $C_{E2}$ and/or discharged, the flow of the static electricity into the non-display area NDA and the display area DA may be prevented. Therefore, damage to the driving circuit unit and pixels may be prevented.

FIGS. 14 to 17 illustrate exemplary embodiments in which the dummy wire 190 is connected to the ground pad GP to thereby discharge static electricity. However, in another embodiment, the dummy wire 190 may be electrically connected to a conductive line arranged in the non-display area NDA of the pixel circuit layer PCL. A voltage lower than a ground voltage or an electrostatic voltage may be applied to the conductive line connected to the dummy wire 190. For example, the dummy wire 190 may be electrically connected to the electrode power supply line 420 (shown in FIG. 18), or a driving voltage line, etc. The electrode power supply line 420 provides a second power voltage ELVSS to the pixels P and the driving voltage line provides a driving voltage to the scan driver 1100. The driving voltage may be a negative voltage lower than the ground voltage or the second power voltage ELVSS. The dummy wire 190 may discharge static electricity via the conductive line connected thereto.

Figure 18:
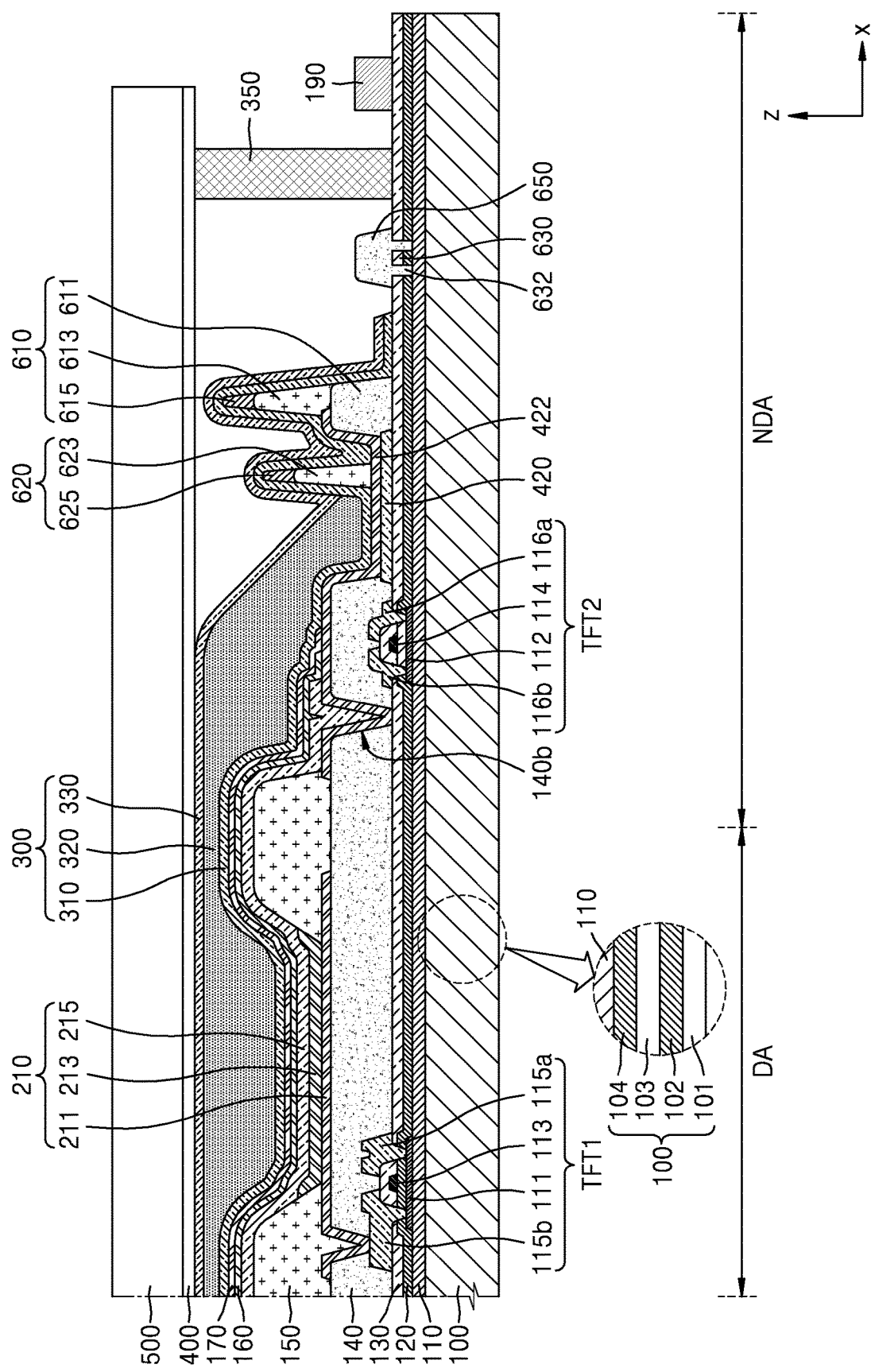
FIG. 18 is a cross-sectional view of a portion of the display panel according to an exemplary embodiment of the present inventive concepts.

FIG. 18 is a cross-sectional view of a portion of the display panel 10A', 10B', or 10C' according to an exemplary embodiment of the present inventive concepts. FIG. 18 may correspond to a magnified cross-section of portions of the display area DA and the non-display area NDA shown in FIG. 13.

Referring to FIG. 18, the substrate 100 may include a glass material or a polymer resin. The substrate 100 may include multiple layers. For example, as shown in the magnified cross-sectional view of FIG. 18, the substrate 100 may include a first base layer 101, a first barrier layer 102, a second base layer 103, and a second barrier layer 104, For example, the first barrier layer 102 may be disposed directly on the first base layer 101. The second base layer 103 may be disposed directly on the first barrier layer 102, The second barrier layer 104 may be disposed directly on the second base layer 103.

The first base layer 101 and the second base layer 103 may each include polymer resin. For example, the first base layer 101 and the second base layer 103 may include a polymer resin such as polyether sulphone (PES), polyarylate (PAR), polyetherimide (PEI), PEN, PET, polyphenylene sulfide (PPS), polyimide (PI), polycarbonate (PC), cellulose triacetate (TAC), cellulose acetate propionate (CAP), etc. The first base layer 101 and the second base layer 103 may include a transparent polymer resin.

The first barrier layer 102 and the second barrier layer 104 are barrier layers configured to prevent penetration of external foreign substances. The first barrier layer 102 and the second barrier layer 104 may include a single layer or multiple layers including an inorganic material such as silicon nitride or silicon oxide.

A buffer layer 110 may be arranged on the substrate 100. The buffer layer 110 is provided to prevent penetration of an impurity into a semiconductor layer of a thin-film transistor. For example, the buffer layer 110 may be disposed directly on the substrate 100. The buffer layer 110 may include an inorganic material such as silicon nitride or silicon oxide. The buffer layer 110 may include a single layer or multiple layers.

A first thin-film transistor TFT1 and an organic light-emitting diode 210 electrically connected thereto may be arranged in the display area DA of the substrate 100. The electrical connection of the organic light-emitting diode 210 to the first thin-film transistor TFT1 may correspond to the electrical connection of a pixel electrode 211 to the first thin-film transistor TFT1. The first thin-film transistor TFT1 may be the first transistor of FIG. 6.

The first thin-film transistor TFT1 may include a semiconductor layer 111, a gate electrode 113, a source electrode 115a, and a drain electrode 115b. The semiconductor layer 11 may include an oxide semiconductor material. The semiconductor layer III may include amorphous silicon, polycrystalline silicon, or an organic semiconductor material. A gate electrode 113 may be arranged over the semiconductor layer 111. The gate electrode 113 may include, for example, at least one material selected from aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu). The gate electrode 113 may include a single-layered or multi-layered structure.

A gate insulating layer 120 may be arranged between the semiconductor layer 111 and the gate electrode 113 to ensure insulation between the semiconductor layer 111 and the gate electrode 113. For example, the gate insulating layer 120 may be disposed directly on the semiconductor layer 111. The gate insulating layer 120 may include an inorganic material, such as silicon oxide, silicon nitride, silicon oxynitride, etc. An interlayer insulating layer 130 may be arranged on the gate electrode 113. The interlayer insulating layer 130 may be provided to have a single-layered or multi-layered structure including an inorganic material such as silicon oxide, silicon nitride, silicon oxynitride, etc.

The source electrode 115a and the drain electrode 115b may be arranged on the interlayer insulating layer 130. For example, the source electrode 115a and the drain electrode 115b may be disposed directly on the interlayer insulating layer 130. The source electrode 115a and the drain electrode 115b may be respectively electrically connected to the semiconductor layer 111 via a contact hole in the interlayer insulating layer 130 and the gate insulating layer 120. The source electrode 115a and the drain electrode 115b may include, for example, at least one material selected from Al, Pt, Pd, Ag, Mg, Au, Ni, Nd, Ir, Cr, Li, Ca, Mo, Ti, W, and Cu. The source electrode 115a and the drain electrode 115b may have a single-layered or multi-layered structure.

A protective layer covering the first thin-film transistor TFT1 may be arranged to protect the first thin-film transistor TFT1, etc. The protective layer may include, for example, an inorganic material such as silicon oxide, silicon nitride, silicon oxynitride, etc. The protective layer may include a single layer or multiple layers.

A planarization layer 140 may be arranged on the protective layer. The planarization layer 140 may planarize an upper surface of the protective layer covering the first thin-film transistor TFT. The planarization layer 140 may include an organic insulating material such as a general-purpose polymer, such as PMMA or polystyrene (PS), a polymer derivative containing a phenol group, an acrylic-based polymer, an imide-based polymer, an aryl ether-based polymer, an amide-based polymer, a fluorine-based polymer, a p-xylene-based polymer, a vinyl alcohol-based polymer, or a combination thereof. FIG. 18 shows that the planarization layer 140 includes a single layer. However, the planarization layer 140 may include multiple layers. In exemplary embodiments in which the planarization layer 140 includes multiple layers, the planarization layer 140 may be variously modified. The display panel 10A, 10B, or 10C may include both the protective layer and the planarization layer 140. Alternatively, the display panel 10A, 10B, or 10C may include only the planarization layer 140 as needed.

The organic light-emitting diode 210 may be arranged on the planarization layer 140 in the display area DA of the substrate 100. For example, the organic light-emitting diode 210 may be disposed directly on the planarization layer. The organic light-emitting diode 210 includes a pixel electrode 211, an opposite electrode 215, and an intermediate layer 213 arranged therebetween. The intermediate layer 213 includes an emission layer.

In the planarization layer 140, a contact hole may be present. The contact hole exposes at least one of the source electrode 115a and the drain electrode 115b in the first thin-film transistor TFT1. The pixel electrode 211 may be arranged on the planarization layer 140. For example, the pixel electrode 211 may be disposed directly on the planarization layer 140. The pixel electrode contacts one of the source electrode 115a and the drain electrode 115b via the contact hole to electrically connect to the first thin-film transistor TFT1. The pixel electrode 211 may be a (semi)transparent electrode or a reflective electrode. In exemplary embodiments in which the pixel electrode 211 is a (semi) transparent electrode, the pixel electrode 211 may include, for example, ITO, IZO, ZnO, indium oxide ($In_2O_3$), indium gallium oxide (IGO), or aluminum zinc oxide (AZO). In exemplary embodiments in which the pixel electrode 211 is a reflective electrode, the pixel electrode 211 may include a reflective layer formed of Ag, Mg, Al, Pt, Pd, Au, Ni, Nd, Ir, Cr, or a compound thereof, and a layer including ITO, IZO, ZnO, $In_2O_3$, IGO, or AZO. However, exemplary embodiments of the present inventive concepts are not limited thereto. The pixel electrode 211 may include various materials or have a single-layered or multi-layered structure. As such, the pixel electrode 211 may be variously modified.

A pixel-defining layer 150 may be arranged on the planarization layer 140. For example, the pixel-defining layer 150 may be disposed directly on the planarization layer 140. The pixel-defining layer 150 may include an opening corresponding to each pixel. For example, the opening may expose at least a center portion of the pixel electrode 211 to thereby define a pixel. In addition, the pixel-defining layer 150 prevents occurrence of an arc, etc. at an edge of the pixel electrode 211 by increasing a distance between the edge of the pixel electrode 211 and the opposite electrode 215 arranged over the pixel electrode 211. The pixel-defining layer 150 may include an organic material such as PI, hexamethyldisiloxane (HMDSO), etc.

The intermediate layer 213 of the organic light-emitting diode 210 includes an emission layer. The emission layer may include a polymer organic material or a low-molecular weight organic material emitting light of a predetermined color. In an exemplary embodiment, the intermediate layer 213 may include a first functional layer arranged below the emission layer and/or a second functional layer arranged above the emission layer. The first functional layer and/or the second functional layer may include a layer integrally arranged over a plurality of pixel electrodes 211. Alternatively, the first functional layer and/or the second functional layer may include a layer patterned in correspondence with each of the plurality of pixel electrodes 211.

The first functional layer may include a single layer or multiple layers. For example, when the first functional layer includes a polymer material, the first functional layer may have a single-layered structure including a hole transport layer (HTL), and include poly(3,4-ethylene dioxythiophene) (PEDOT) or polyaniline (PANI). When the first functional layer includes a low-molecular weight organic material, the first functional layer may include a hole injection layer (HIL) and an HTL.

The second functional layer may be omitted. For example, when the first functional layer and the emission layer include a polymer material, the second functional layer may be provided to enhance characteristics of the organic light-emitting diode 210. The second functional layer may include a single layer or multiple layers. The second functional layer may include an electron transport layer (ETL) and/or an electron injection layer (Ell).

The opposite electrode 215 may be integrally arranged over the display area DA and the non-display area NDA. The opposite electrode 215 may be integrally formed in correspondence with a plurality of organic light-emitting diodes 210 to face the pixel electrodes 211. The opposite electrode 215 may be a (semi)transparent electrode or a reflective electrode. In exemplary embodiments in which the opposite electrode 215 is a (semi)transparent electrode, the opposite electrode 215 may include metal having a low work function. For example, the opposite electrode 215 including a metal having a low work function may include a layer including Li, Ca, lithium-fluoride-calcium (LiF/Ca), lithium-fluoride-aluminum (LiF/Al), Al, Ag, Mg, or a compound thereof and a (semi)transparent conductive layer including ITO, IZO, ZnO, or $In_2O_3$, etc. In exemplary embodiments in which the opposite electrode 215 is a reflective electrode, the opposite electrode 215 may include a layer including Li, Ca, LiF/Ca, LiF/Al, Al, Ag, Mg, or a compound thereof. However, a composition and a material of the opposite electrode 215 are not limited thereto, and may be variously modified.

The electrode power supply line 420 may be located in the non-display area NDA and may transmit a preset electrical signal to the opposite electrode 215. The electrode power supply line 420 may include the same material as various conductive layers in the display area DA. In an exemplary embodiment, the electrode power supply line 420 may be formed at the same time as the various conductive layers are formed in the display area DA. In the exemplary embodiment shown in FIG. 18, the electrode power supply line 420 is located on the interlayer insulating layer 130 in the non-display area NDA. In this embodiment, the electrode power supply line 420 is formed on the interlayer insulating layer 130 at the same time and, using the same material, as the source electrode 115a and the drain electrode 115b of the first thin-film transistor TFT1 formed in the display area DA. Accordingly, the electrode power supply line 420 may have the same structure as the source electrode 115a and the drain electrode 115b. However, exemplary embodiments of the present inventive concepts are not limited thereto. For example, the electrode power supply line 420 may be formed at the same time and, using the same material, as the gate electrode 113 on the gate insulating layer 120. As such, various modifications may be made.

The opposite electrode 215 may not be in direct contact with the electrode power supply line 420 but be electrically connected to the electrode power supply line 420 via the conductive layer 422. An opening exposing the electrode power supply line 420 may be arranged in the planarization layer 140. For example, the conductive layer 422 on the planarization layer 140 may extend to the electrode power supply line 420 exposed by the opening to electrically connect to the electrode power supply line 420. Accordingly, the opposite electrode 215 may be in contact with the conductive layer 422 in the non-display area NDA, and the conductive layer 422 may be in contact with the electrode power supply line 420 in the non-display area NDA.

The conductive layer 422 may be located on the planarization layer 140 and formed of the same material as an element located on the planarization layer 140 in the display area DA. In exemplary embodiments in which the pixel electrode 211 in the display area DA is formed on the planarization layer 140, the conductive layer 422 may be formed of the same material as the pixel electrode 211 on the planarization layer and at the same time as the pixel electrode 211 in the non-display area NDA. Accordingly, the conductive layer 422 may have the same structure as the pixel electrode 211. The conductive layer 422 may not be covered by the planarization layer 140. The conductive layer 422 may cover an exposed portion of the electrode power supply line 420. By doing so, when a first dam 610 or a second dam 620 is formed, damage to the electrode power supply line 420 may be prevented by the conductive layer 422 disposed thereon.

To prevent penetration of an impurity such as external oxygen, moisture, or the like into the display area DA via the planarization layer 140, the planarization layer 140 may have an opening 140b in the non-display area NDA. The conductive layer 422 and the opposite electrode 215 may completely cover the opening 140b. By doing so, when an impurity penetrates the planarization layer 140 in the non-display area NDA, the impurity may be effectively prevented from penetrating the planarization layer 140 in the display area DA.

In the non-display area NDA of the substrate 100, a second thin-film transistor TFT2 may be arranged. For example, in an exemplary embodiment, the second thin-film transistor TFT2 may be a part of a driving circuit unit (e.g., a scan driver, etc.) configured to control an electrical signal applied to the display area DA. The second thin-film transistor TFT2 may include a semiconductor layer 112, a gate electrode 114, a source electrode 116a, and a drain electrode 116b. The second thin-film transistor TFT2 may be formed by using a same process as the first thin-film transistor TFT1. Accordingly, a detailed description of the second thin-film transistor TFT2 is omitted here. FIG. 18 shows that the second thin-film transistor TFT2 is arranged (e.g., in the x direction) between the opening 140b of the planarization layer 140 and the electrode power supply line 420. However, exemplary embodiments of the present inventive concepts are not limited thereto. For example, in another exemplary embodiment, the second thin-film transistor TFT2 may be arranged between the display area DA and the opening 140b of the planarization layer 140.

A capping layer 160 may be arranged on the opposite electrode 215. For example, the capping layer 160 may be disposed directly on the opposite electrode 215. The capping layer 160 may cover the opposite electrode 215 and extend outside of the opposite electrode 215 (e.g., in the x direction) and contact the conductive layer 422 below the opposite electrode 215. The capping layer 160 may cover the display area DA and extend to the non-display area NDA. The capping layer 160 may include at least one organic material or inorganic material selected from $SiO_2$, $SiN_x$, zinc peroxide ($ZnO_2$), $TiO_2$, zirconium dioxide ($ZrO_2$), ITO, IZO, tris-8-hydroxyquinoline aluminum ($Alq_3$), copper phthalocyanine (CuPc), 4,4'-bis(N-carbazolyl)-1,1'-biphenyl (CBP), N,N'-di(naphthalene-1-yl)-N,N'-diphenyl-benzidine (a-NPB), and zirconium dioxide ($ZiO_2$).

The capping layer 160 may enhance efficiency of light generated from the organic light-emitting diode 210. For example, the capping layer 160 may improve the efficiency of light extraction to the outside. The efficiency improvement performed by the capping layer 160 may be made uniformly in the display area DA. Consequently, the capping layer 160 may have an upper surface (e.g., in the z direction) corresponding to a curve of an upper surface of a layer below the capping layer 160. For example, the capping layer 160 may be disposed directly on the opposite electrode 215 and the upper surface of the capping layer may have a shape corresponding to a curve of an upper surface of the opposite electrode 215.

A thin-film encapsulation layer 300 may be located over the capping layer 160. The thin-film encapsulation layer 300 protects the organic light-emitting diode 210 from external moisture, oxygen, etc. The thin-film encapsulation layer 300 may extend within the display area DA and the non-display area NDA. The thin-film encapsulation layer 300 may have a multi-layered structure. The thin-film encapsulation layer 300 may include a first inorganic layer 310, an organic layer 320, and a second inorganic layer 330.

The first inorganic layer 310 may cover the capping layer 160 and include silicon oxide, silicon nitride, silicon oxynitride, etc. Since the first inorganic layer 310 is arranged along a structure therebelow, an upper surface of the first inorganic layer 310 may not be flat.

The organic layer 320 may cover the first inorganic layer 310 and have a sufficient thickness. For example, the organic layer 320 may be disposed directly on the first inorganic layer 310. An upper surface of the organic layer 320 (e.g., in the z direction) may be substantially fat over the entire display area DA. The organic layer 320 may include at least one material selected from the group consisting of PEN, PC, PI, polyethylene sulfonate, polyoxymethylene, polyarylate, and HMDSO.

The second inorganic layer 330 may cover the organic layer 320 and include silicon oxide, silicon nitride, silicon oxynitride, etc. For example, the second inorganic layer 330 may be disposed directly on the organic layer 320. The second inorganic layer 330 may extend to outside of the organic layer 320 (e.g., in the x direction) to contact the first inorganic layer 310 so that the organic layer 320 is sealed by the first and second inorganic layers and is not exposed to the outside.

Since the thin-film encapsulation layer 300 is formed to have a multi-layered structure, even when cracks occur in the thin-film encapsulation layer 300, the cracks may not be connected to each other between the first inorganic layer 310 and the organic layer 320 or between the organic layer 320 and the second inorganic layer 330. This prevents or minimizes the formation of a path which external moisture, oxygen, etc. penetrates into the display area DA.

Structures positioned below the thin-film encapsulation layer 300 may be damaged when the thin-film encapsulation layer is formed. For example, when the first inorganic layer 310 is formed, a layer arranged directly below the first inorganic layer 310 may be damaged. Accordingly, to prevent damage of the capping layer 160 when the thin-film encapsulation layer 300 is formed, a protective layer 170 may be arranged between the capping layer 160 and the thin-film encapsulation layer 300. For example, the protective layer 170 may be disposed directly on the capping layer 160. The protective layer 170 may include lithium-fluoride (Lif). The protective layer 170 may extend to outside of the capping layer 160 so that the capping layer 160 is not in direct contact with the thin-film encapsulation layer 300. In this embodiment, the protective layer 170 may cover an end of the capping layer 160 and an end of the protective layer 170 is located on the planarization layer 140. On the planarization layer 140, an end of the protective layer 170 may be in direct contact with the conductive layer 422.

The bonding force of the first inorganic layer 310 which is a lowest layer of the thin-film encapsulation layer 300 is greater with a layer that includes an inorganic material as compared to a layer that includes an organic material. Accordingly, when the capping layer 160 includes an organic material, since a bonding force between the protective layer 170 including an inorganic material such as LiF and the first inorganic layer 310 is greater than a bonding force between the capping layer 160 and the first inorganic layer 310, a large bonding force between the thin-film encapsulation layer 300 and a layer below the thin-film encapsulation layer may be maintained. Accordingly, in a manufacturing process or a process of use after manufacture, delamination of the thin-film encapsulation layer 300 from a layer below the thin-film encapsulation layer may be effectively prevented or minimized.

When the organic layer 320 is formed, the material of the organic layer 320 may be confined to a predetermined area. As shown in the exemplary embodiment of FIG. 18, a first dam 610 may be formed in the non-display area NDA to confine the organic layer 320. The first dam 610 may have a multi-layered structure. The first dam 610 may include a first layer 611, a second layer, 613, and a third layer 615 arranged in the z direction. The first layer 611 may be formed of the same material as the planarization layer 140 and at the same time as the planarization layer 140. The second layer 613 may be formed of the same material as the pixel-defining layer 150 and at the same time as the pixel-defining layer. The third layer 615 may include the same material as the pixel-defining layer 150. Alternatively, the third layer 615 may be an organic material layer or an inorganic material layer formed by a separate process.

The second dam 620 may be located between the first dam 610 and the opening 140b (e.g., in the x direction). The second dam 620 may be located at a portion of the conductive layer 422 on the electrode power supply line 420. For example, the second dam 620 may be disposed directly on a portion of the conductive layer. The second dam 620 may have a multi-layered structure. In an exemplary embodiment, the second dam 620 may include less layers than the first dam 610. In this exemplary embodiment, the second dam 620 may be shorter than the first dam 610 with respect to the substrate 100. The second dam 620 may include a first layer 623 and a second layer 625 arranged in the z direction. The first layer 623 may be formed of the same material as the pixel-defining layer 150 and at the same time as the pixel-defining layer. The second layer 625 may include the same material as the pixel-defining layer 150. However, in other exemplary embodiments, the second layer 625 may be an organic material layer or an inorganic material layer formed by using a separate process.

The first inorganic layer 310 may be arranged to cover the second dam 620 and the first dam 610 and extend to outside of the first dam 610. For example, the first inorganic layer 310 may be disposed directly on the second layer 625 of the second dam 620 and the third layer 615 of the first dam 610. A position of the organic layer 320 on the first inorganic layer 310 is limited by the second dam 620. Therefore, a material of the organic layer 320 may be prevented from overflowing to outside of the second dam 620 (e.g., in the z direction). Furthermore, even when the material of the organic layer 320 partially overflows to outside of the second dam 620, since the position of the organic layer 320 is limited by the first dam 610, the material of the organic layer 320 may be prevented from moving in a direction toward an edge of the substrate 100.

A crack prevention dam 630 may be located in the non-display area NDA. The crack prevention dam 630 may extend along at least a portion of an edge of the substrate 100. For example, the crack prevention dam 630 may have a shape surrounding the display area DA. In some sections, the crack prevention dam 630 may have a discontinuous shape.

The crack prevention dam 630 may have various shapes. The crack prevention dam 630 may be formed of the same material as the elements in the display area DA and at the same time as the elements. Alternatively, the crack prevention dam 630 may have a multi-layered structure. FIG. 18 shows that the crack prevention dam 630 has a structure including two layers. The crack prevention dam 630 may include a lower layer and an upper layer. In an exemplary embodiment, the lower layer includes the same material as the gate insulating layer 120 and the upper layer includes the same material as the interlayer insulating layer 130 on the gate insulating layer 120. The crack prevention dam 630 may be located on the buffer layer 110. For example, the crack prevention dam 630 may be disposed directly on the buffer layer 110. However, in other exemplary embodiments, the crack prevention dam 630 may be located on a layer below the buffer layer 110. In this embodiment, the crack prevention dam 630 may include a layer including the same material as the buffer layer 110. A plurality of crack prevention dams 630 instead of one crack prevention dam 630 may be provided and the plurality of crack prevention dams may be spaced apart from each other (e.g., in the x direction).

The crack prevention dam 630 is formed by removing portions of the gate insulating layer 120 and the interlayer insulating layer 130. Consequently, as shown in FIG. 18, a transfer prevention groove 632 is formed on at least a side of the crack prevention dam 630 by removing portions of the gate insulating layer 120 and the interlayer insulating layer 130. The crack prevention dam 630 may include remaining portions of the gate insulating layer 120 and the interlayer insulating layer 130, each adjacent to the transfer prevention groove 632. For example, as shown in FIG. 18, two transfer prevention grooves 632 are formed on each lateral side (e.g., in the x direction) of the crack prevention dam.

The crack prevention dam 630 may be covered by a cover layer 650. The cover layer 650 may be formed of the same material as the planarization layer 140 and at same time as the planarization layer 140. The cover layer 650 may be a layer including an organic material covering the crack prevention dam 630 including an inorganic material. The cover layer 650 may fill the transfer prevention groove 632 and cover the crack prevention dam 630.

The color filter 500 as described in FIGS. 7-8 may be located over the thin-film encapsulation layer 300.

The conductive layer 400 may be located between the thin-film encapsulation layer 300 and the color filter 500. For example, the conductive layer 400 may be arranged on an entire bottom surface of the color filter 500 (e.g., in the z direction) to overlap the display area DA and the non-display area NDA of the substrate 100. The conductive layer 400 may be spaced apart from a conductive line (e.g., the electrode power supply line 420) in the non-display area NDA of the substrate 100 in the z direction to thereby form a capacitor configured to store static electricity, with the conductive line. As shown in FIG. 18, the conductive layer 400 overlaps the sealant 350, and a portion of the conductive layer 400 overlaps the dummy wire 190. The conductive layer 400 may further form the capacitor configured to store static electricity with the dummy wire 190. In another exemplary embodiment, the conductive layer 400 may not overlap the sealant 350. The conductive layer 400 may be arranged only inside the sealant 350 (e.g., in the x direction) and does not overlap the dummy wire 190.

FIG. 18 shows that the conductive layer 400 is arranged on a bottom surface (e.g., in the z direction) of the color filter 500. However, in another exemplary embodiment, the conductive layer 400 may be arranged on an entire upper surface of the thin-film encapsulation layer 300. The conductive layer 400 may have an upper surface corresponding to a curve of an upper surface of the thin-film encapsulation layer 300 below the conductive layer 400. Therefore, the upper surface of the conductive layer 400 on the thin-film encapsulation layer 300 may have a shape corresponding to a curve of the upper surface of the thin-film encapsulation layer 300. In this embodiment, the conductive layer 400 may also be spaced apart from a conductive line (e.g., the electrode power supply line 420) in the non-display area NDA of the substrate 100 in the z direction to thereby form a capacitor configured to store static electricity with the conductive line.

The sealant 350 may be arranged in the non-display area NDA. The sealant 350 may be located in an outer position compared to that of the crack prevention dam 630. For example, the sealant 350 may be located outside the crack prevention dam in the x direction. The sealant 350 may surround the display area DA in a plan view (e.g., in directions parallel to a top surface of the substrate 100). The sealant 350 may bond the substrate 100 to the color filter 500. A space defined by the substrate 100, the color filter 500, and the sealant 350 may be sealed from the outside to thereby prevent penetration of external moisture and impurities. A filling material may be arranged in a space between the substrate 100 and the color filter 500. The filling material may include at least one selected from a photocurable epoxy-based material and an acrylate-based material. However, exemplary embodiments of the present inventive concepts are not limited thereto.

In an exemplary embodiment, the sealant 350 may include a frit, epoxy, or the like. A frit may be paste having $SiO_2$, etc. as a main material and may include a laser beam or infrared light absorbing material, an organic binder, a filler configured to reduce a thermal expansion coefficient, or the like. A frit in the paste may undergo drying and sintering processes so that the organic binder and moisture are removed from the frit and the frit is hardened. The laser beam and infrared light absorbing material may include transition metal oxide. The frit may be hardened by a laser, etc. to thereby form the sealant 350.

In the non-display area NDA of the substrate 100, the dummy wire 190 may be further arranged outside the sealant 350. The dummy wire 190 may extend along at least one side of the substrate 100. The dummy wire 190 may be electrically connected to a ground voltage source (e.g., the ground pad GP of FIG. 14), the electrode power supply line 420, or a driving voltage line configured to provide a driving voltage to the scan driver 1100. The dummy wire 190 may overlap the conductive layer 400. Alternatively, the dummy wire 190 may not overlap the conductive layer 400.

While exemplary embodiments of the present inventive concepts have been described with respect to specific directions (e.g., the x direction, the y direction and the z direction), the directions may be modified without departing from the scope of the present inventive concepts.

According to the exemplary embodiments of the present inventive concepts, circuit elements in a non-display area and a display area of a display panel may be protected from static electricity. Therefore, a defect in a display device may be prevented.

While the present disclosure has been particularly shown and described with reference to exemplary embodiments thereof, it will be understood by those of ordinary skill in the art that various changes in form and details may be made therein without departing from the spirit and scope of the present disclosure as defined by the following claims.

What is claimed is:
1. A display device comprising:
a first substrate comprising, a display area and a non-display area, the first substrate including a conductive line in the non-display area;
a second substrate facing the first substrate and spaced apart from the first substrate; and
a conductive layer disposed between the first substrate and the second substrate, the conductive layer spaced apart from the first substrate in a direction perpendicular to a top surface of the first substrate, wherein the conductive layer at least partially overlaps the conductive line and is electrically floated so that the conductive layer does not receive a voltage from a voltage source of the display device or a current from a current source of the display device.

2. The display device of claim 1, wherein the conductive layer comprises a transparent conductive layer that is disposed on an entire sur-face of the second substrate lacing the first substrate.

3. The display device of claim 1, wherein the conductive layer and the conductive line form a first capacitor that is configured to store static electricity flowing into the conductive layer.

4. A display device comprising:
   a first substrate comprising a display area and a non-display area, the first substrate including a conductive line in the non-display area;
   a second substrate facing the first substrate and spaced apart from the first substrate;
   a conductive layer disposed between the first substrate and the second substrate, the conductive layer spaced apart from the first substrate in a direction perpendicular to a top surface of the first substrate, wherein the conductive layer at least partially overlaps the conductive line and is electrically floated; and
   a dummy wire disposed in the non-display area of the first substrate, the dummy wire is spaced apart from the conductive line in a direction parallel to the top surface of the first substrate, and is disposed outside the conductive line.

5. The display device of claim 4, wherein the dummy Wire is disposed outside a driving circuit unit that is disposed in the non-display area.

6. The display device of claim 4, wherein the dummy wire is connected to a dummy pad that a ground voltage applied thereto.

7. The display device of claim 4, further comprising:
   a pixel disposed in the display area of the first substrate, the pixel comprising a display element that includes a first electrode, a second electrode that faces the first electrode, and an emission layer that is disposed between the first electrode and the second electrode.

8. The display device of claim 7, wherein the dummy wire is electrically connected to a power line that contacts the second electrode of the display element in the non-display area of the first substrate.

9. The display device of claim 4, wherein the dummy wire extends along at least a side of the first substrate in the non-display area of the first substrate.

10. The display device of claim 4, wherein:
    the conductive layer overlaps the dummy wire in the direction perpendicular to the top surface of the first substrate, and
    the conductive layer and the dummy wire form a second capacitor that is configured to discharge static electricity that is stored in the second capacitor via the dummy wire.

* * * * *